(12) United States Patent
Whetsel

(10) Patent No.: US 8,281,196 B2
(45) Date of Patent: Oct. 2, 2012

(54) DEVICE ADDRESS PORT CIRCUITRY WITH LOCAL, GROUP, AND GLOBAL OUTPUTS

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/238,736

(22) Filed: Sep. 21, 2011

(65) Prior Publication Data

US 2012/0011412 A1 Jan. 12, 2012

Related U.S. Application Data

(62) Division of application No. 12/401,028, filed on Mar. 10, 2009, now Pat. No. 8,046,650.

(60) Provisional application No. 61/036,686, filed on Mar. 14, 2008.

(51) Int. Cl.
*G01R 31/28* (2006.01)
(52) U.S. Cl. ........................ 714/729; 714/734
(58) Field of Classification Search .................. 714/724, 714/726, 727, 729, 733, 734
See application file for complete search history.

(56) References Cited

U.S. PATENT DOCUMENTS

| 6,327,681 | B1 * | 12/2001 | Yamagishi et al. | 714/718 |
| 7,213,185 | B2 * | 5/2007 | Barone et al. | 714/733 |
| 8,046,650 | B2 * | 10/2011 | Whetsel | 714/729 |
| 2006/0123306 | A1 * | 6/2006 | Whetsel | 714/744 |

OTHER PUBLICATIONS

Xu Chuan-pei; Dai Kui; , "The optimization of hierarchical SOC test architecture to reduce test time," Electronic Packaging Technology & High Density Packaging, 2008. ICEPT-HDP 2008. International Conference on , vol., No., pp. 1-4, Jul. 28-31, 2008.*
Sehgal, A.; Iyengar, V.; Chakrabarty, K.; , "SOC test planning using virtual test access architectures," Very Large Scale Integration (VLSI) Systems, IEEE Transactions on , vol. 12, No. 12, pp. 1263-1276, Dec. 2004.*
Whetsel, L.;, "Inevitable use of TAP domains in SOCs," Test Conference, 2002. Proceedings. International, vol., No., pp. 1191, 2002 doi: 10.1109/TEST.2002.*

* cited by examiner

*Primary Examiner* — Cynthia Britt
(74) *Attorney, Agent, or Firm* — Lawrence J. Bassuk; W. James Brady; Frederick J. Telecky, Jr.

(57) ABSTRACT

The disclosure describes a novel method and apparatus for making device TAPs addressable to allow device TAPs to be accessed in a parallel arrangement without the need for having a unique TMS signal for each device TAP in the arrangement. According to the disclosure, device TAPs are addressed by inputting an address on the TDI input of devices on the falling edge of TCK. An address circuit within the device is associated with the device's TAP and responds to the address input to either enable or disable access of the device's TAP.

4 Claims, 22 Drawing Sheets

LOCAL ACCESS STEPS

- INPUT LOCAL ADDRESS 1
- ACCESS DEVICE 1 TAP
- INPUT LOCAL ADDRESS 2
- ACCESS DEVICE 2 TAP
- INPUT LOCAL ADDRESS N
- ACCESS DEVICE N TAP

FIG. 13A

GROUP ACCESS STEPS

- INPUT LOCAL ADDRESS 1
- LOAD GROUP ADDRESS IN DEVICE 1
- INPUT LOCAL ADDRESS 2
- LOAD GROUP ADDRESS IN DEVICE 2
- INPUT GROUP ADDRESS
- ACCESS DEVICE 1 AND 2 TAPS

FIG. 13B

GLOBAL ACCESS STEPS

- INPUT GLOBAL ADDRESS
- ACCESS ALL DEVICE TAPS

FIG. 13C

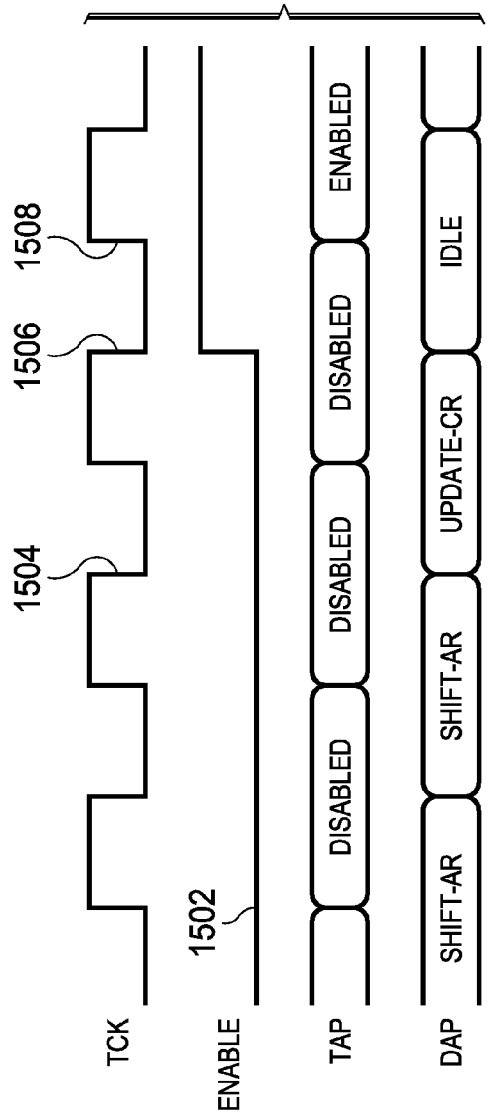
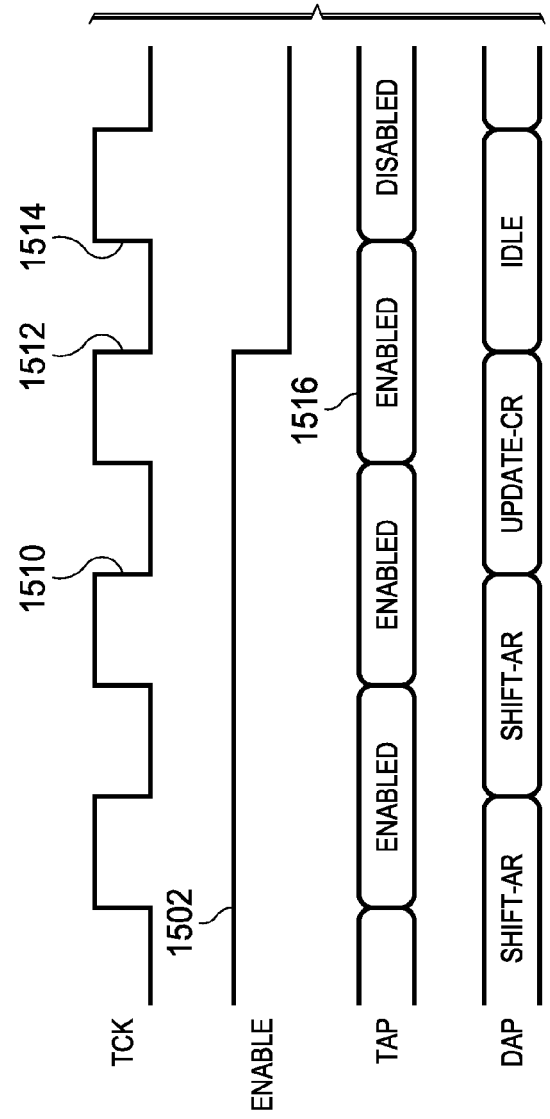

DEVICE ADDRESS PORT CIRCUITRY WITH LOCAL, GROUP, AND GLOBAL OUTPUTS

CROSS REFERENCE TO RELATED PATENTS

This applications is a Divisional of prior application Ser. No. 12/401,028, filed Mar. 10, 2009, now U.S. Pat. No. 8,046, 650, issued Oct. 25, 2011; Which claims priority from Provisional Application No. 61/036,686, filed Mar. 14, 2008, and is related to U.S. Pat. No. 6,073,254 which is incorporated herein by reference.

FIELD OF THE DISCLOSURE

This disclosure relates in general to devices using JTAG Test Access Ports and in particular to devices using addressable JTAG Test Access Ports.

BACKGROUND OF THE DISCLOSURE

Most electrical devices today, which may be boards, ICs or embedded cores within ICs, use the IEEE 1149.1 standard TAP and interface (referred to hereafter as JTAG TAP interface) to perform a variety of necessary operations, including but not limited to hardware test operations, hardware diagnostic operations, hardware/software debug operations, software trace operations and hardware programming operations. A number of additional IEEE standards have been created that also utilized the JTAG TAP interface to perform standardized operations beyond what the original JTAG TAP standard was designed to perform. Some of these additional IEEE standards include 1149.4, 1149.6, 1149.7, 1532, 1581, 1687, and 1500. The JTAG TAP interface of a device includes a test data input (TDI) terminal, a test clock (TCK) terminal, a test mode select (TMS) terminal, a test data output (TDO) terminal, and optionally a test reset (TRST) terminal. These device TAP interface terminals are dedicated and thus are available for enabling the above mentioned device operations at any point in the devices lifetime, i.e. device manufacturing through device system application.

FIG. 1 illustrates the standard JTAG TAP 100 within a device. The TAP 100 includes a TAP state machine (TSM) 102, an instruction register 104, data registers 106, TDO multiplexing circuitry 108, TDO output FF 110 and TDO output buffer 112. The TSM 102 has inputs coupled to the TMS 118 and TCK 120 device terminals and control outputs coupled to the other circuits within the TAP. The TRST input of TSM 102 may be coupled to a TRST device terminal 124 or to an internal power on reset circuit (POR) 114. The instruction register 104 and data registers 106 have inputs coupled to the TDI 116 device terminal and have serial outputs coupled to multiplexer 108. FF 110 has an input coupled to the output of multiplexer 108 and an output coupled to output buffer 112. When enabled, buffer 112 outputs data to the TDO device terminal 122.

The TMS, TCK and optional TRST terminals, are connected to the JTAG controller. The TDI terminal may be connected to the JTAG controller or to the TDO terminal of a leading device TAP in a series arrangement. The TDO terminal may be connected to the JTAG controller or to the TDI terminal of a trailing device TAP in a series arrangement. The TSM 102 responds to TMS and TCK according to the TAP state diagram of FIG. 3 to; (1) enter a Test Logic Reset state 302, (2) enter a Run Test/Idle state 304, (3) to perform a data register scan operation 306 from TDI to TDO, or (4) to perform an instruction scan operation 308 from TDI to TDO.

FIG. 2 illustrates a timing example of the TCK, TMS, TDI and TDO signals according to the IEEE 1149.1 standard. As seen, TMS, TDI and TDO signals transition on the falling edge of TCK and are sampled on the rising edge of TCK. The structure and operation of the TAP, its state diagram, and timing of its TDI, TCK, TMS and TDO signals are well known in the industry.

As seen in FIG. 4-6, a JTAG TAP controller may be coupled to the TAP 100 terminals of a single device (FIG. 4), to the TAP 100 terminals of a group of parallel arranged devices (FIG. 5), or to the TAP 100 terminals of a group of serially arranged devices (FIG. 6). In FIG. 5, a connection between a JTAG controller and the TAP terminals of a group of parallel arranged devices requires the JTAG controller to have a dedicated TMS signal for each of the parallel devices, so that each device TAP 100 can be separately accessed. For example, if 20 parallel devices are connected to a controller, the controller would have to have 20 TMS 118 signals, in addition to the TDI 116, TCK 120, and TDO 122 signals.

The parallel arrangement of FIG. 5 is preferred over the serial arrangement of FIG. 6 in a number of situations. One situation is when the TAPs of devices 1-N have different maximum TCK operation rates. For example, device 1 may have a maximum TCK rate of 10 Mhz while device N has a maximum TCK rate of 100 Mhz. If devices 1 and N were serially arranged as shown in FIG. 6, the 100 Mhz TCK operation rate of device N could never be exploited since the 10 Mhz maximum TCK operation rate of device 1 would set the speed at which the serially arranged device TAPs operate. If devices 1 and N were parallel arranged as shown in FIG. 5, each device could be accessed separately and at it maximum TCK rate. Being able to access a device's TAP at is maximum TCK is essential for decreasing the time it takes to execute device operations such as, but not limited to, test, debug, trace, and programming operations.

Another situation where the parallel arrangement of FIG. 5 is preferred over the serial arrangement of FIG. 6 is when reliable access to a device TAP is required. For example, in FIG. 6, since all device TAPs are in series, a failure in one device TAP would disable access to all other device TAPs. However in FIG. 5 the access to a device TAP is not dependent upon the operation of another device TAP. So the parallel arrangement of FIG. 5 is more tolerant to faults than the serial arrangement of FIG. 6.

While the parallel TAP arrangement of FIG. 5 is advantageous in the above mentioned situations, the increase in interface wiring (TMS signals 1-N) between the controller and parallel devices is problematic in applications where the number of JTAG signal connections must be limited to only the required TDI, TCK, TMS and TDO signals. As will be described in detail below, the disclosure advantageously provides a method and apparatus for enabling a JTAG controller to access parallel arranged device TAPs to achieve the benefits mentioned above using only the required TDI, TCK, TMS and TDO JTAG signal bus.

BRIEF SUMMARY OF THE DISCLOSURE

The disclosure provides a novel method and apparatus for adapting device TAPs with addressability such that parallel arranged device TAPs may be individually accessed by a JTAG controller using an addressing scheme whereby addresses for selecting device TAPs for access is transmitted from the controller to the device on falling edge of the TCK signal.

BRIEF DESCRIPTION OF THE VIEWS OF THE DRAWINGS

FIG. 13A illustrates the steps of using a Local address to select a device ATAP for access, according to the disclosure.

FIG. 13B illustrates the steps of using a Group address to select a group of device ATAPs for access, according to the disclosure.

FIG. 13C illustrates the steps of using a Global address to select all device ATAPs for access, according to the disclosure.

FIG. 15B illustrates the timing of inputting an address into the ATAP's DAP to enable the ATAP's TAP.

FIG. 15C illustrates the timing of inputting an address into the ATAP's DAP to disable the ATAP's TAP.

DETAILED DESCRIPTION OF THE DISCLOSURE

Figure 1:
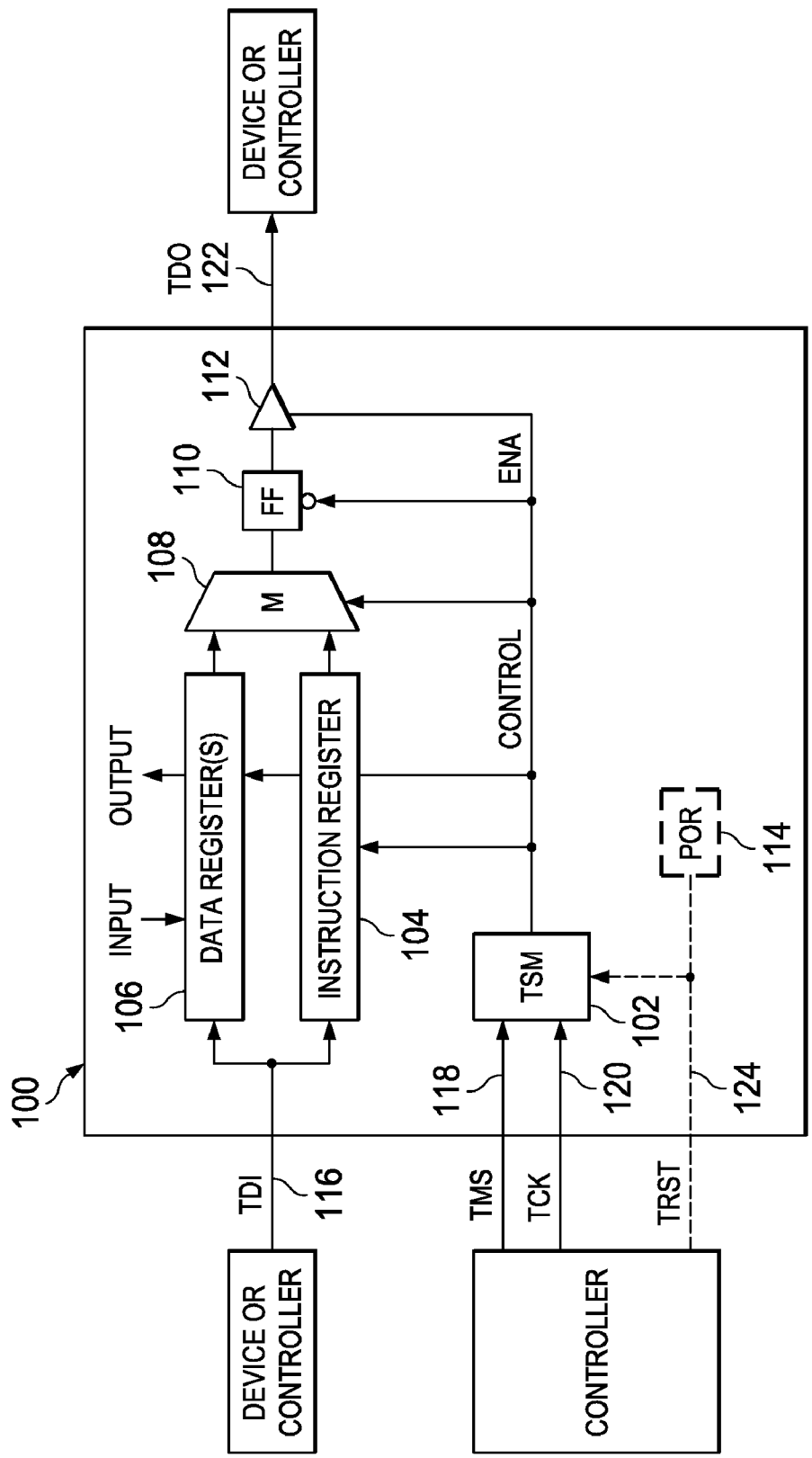
FIG. 1 illustrates a conventional IEEE standard 1149.1 (JTAG) test access port (TAP) of a device connected to a JTAG controller or other device TAPs.
Figure 2:
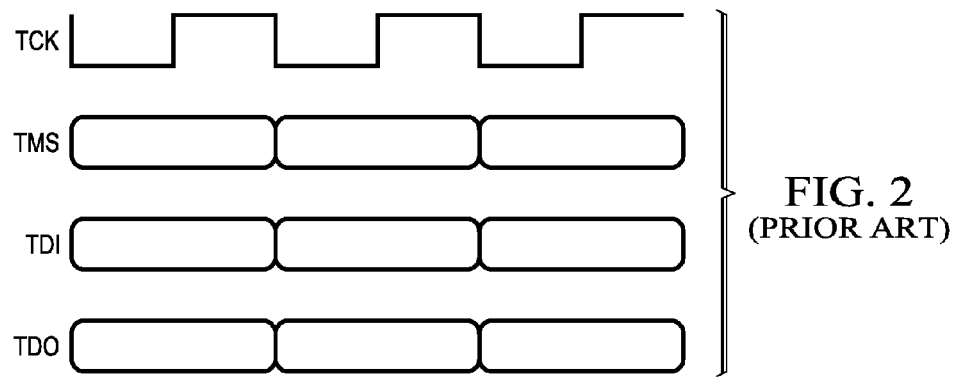
FIG. 2 Illustrates the TCK, TMS, TDI and TDO timing of a conventional 1149.1 TAP.
Figure 7:
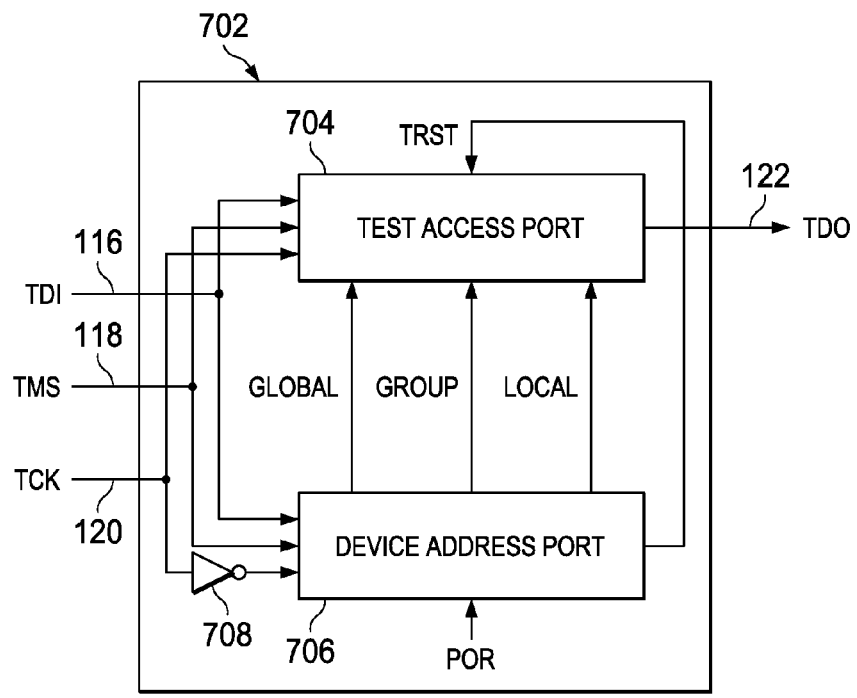
FIG. 7 illustrates an example implementation of an addressable TAP (ATAP) according to the disclosure.

FIG. 7 illustrates the addressable TAP (ATAP) circuit 702 according to the present disclosure. The ATAP 702 consists of a TAP 704 and a Device Address Port (DAP) circuit 706. TAP 704 is the same as TAP 100 of FIG. 1 with the exception that it has been adapted to be enabled, disabled and reset by DAP 706. The TDI 116 input of ATAP 702 is coupled to TAP 704 and DAP 706. The TMS 118 input of ATAP 702 is coupled to TAP 704 and DAP 706. The TCK 120 input of ATAP 702 is coupled to TAP 704 and inverted by inverter 708 and coupled to DAP 706. The TDO 122 output of ATAP is coupled to TAP 704. The DAP outputs three types of enable signals to the TAP, a Global enable signal, a Group enable signal and a Local enable signal. These signals, as will be described later, are used to enable and disable the operation of the TAP. The DAP also outputs a TRST signal to the TAP's TRST input. The TRST signal is used to reset the TAP. The DAP has a reset input that may be connected to a power up reset (POR) circuit within the device or to an external device terminal. A connection to a POR circuit is indicated in this example.

Figure 8:
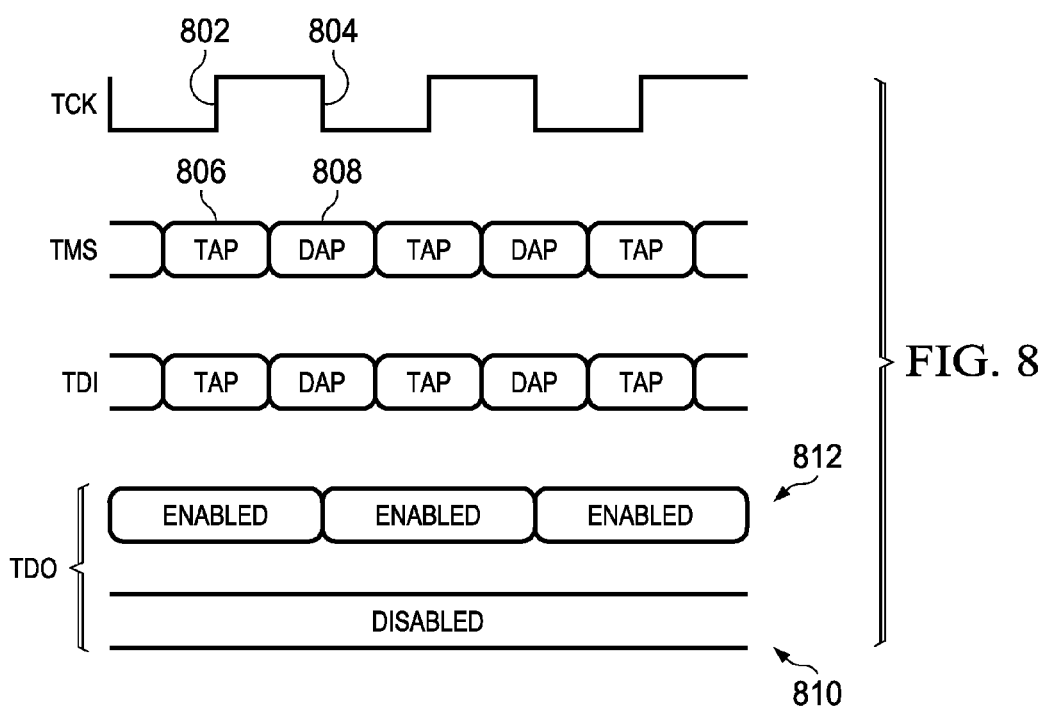
FIG. 8 illustrates the TCK, TMS, TDI and TDO timing of the ATAP of FIG. 7, according to the disclosure.

FIG. 8 illustrates the timing of the ATAP's TDI, TCK, TMS and TDO signals. When enabled by a Global, Group or Local signal from the DAP, the TAP 704 responds conventionally to TDI and TMS input on the rising edge 802 of TCK. The Global enable signal is used to enable all device TAPs in a parallel arrangement of multiple device TAPs. The Group enable signal is used to enable selected subset group of parallel device TAPs in a parallel arrangement of multiple device TAPs. The Local enable signal is use to enable a single device TAP in a parallel arrangement of multiple device TAPs. When device TAPs are enabled by the Global or Group enable signal, the device TAPs can input TDI and TMS data but cannot output TDO data (TDO output buffer 112 is disabled). When a device TAP is enabled by the Local enable signal, the device TAP can input TDI and TMS data and output TDO data (TDO output buffer 112 is enabled).

The DAP 706, importantly and according to the disclosure, responds to TDI and TMS on the falling edge of TCK to input an address that may enable the TAP via one of the Global, Group and Local enable signals. To achieve the rising edge TDI and TMS input to the TAP and falling edge TDI and TMS input to the DAP, a connected controller will be designed to input two data bits per TCK period on the TDI and TMS signals, one for the TAP 806 and one for the DAP 808. Each data bit will be presented to the TAP and DAP at an appropriate time prior to the rising and falling edge of the TCK, respectively. As seen in the timing diagram, when the TAP is not enabled by the DAP, or when the TAP is enabled by the Global or Group enable signal, the TAP's TDO signal 810 will be disabled from driving data onto to the TDO terminal. When the TAP is enabled by the Local enable signal from the DAP, the TAP's TDO signal 812 is enabled to drive data onto the TDO terminal in accordance to the conventional TDO output operation of the TAP.

It should be understood from FIGS. 7 and 8 that the presence and operation of the DAP in ATAP 702 is transparent to the conventional operation of the TAP to input TDI and TMS data when the TAP is enabled by a Global or Group signal. It should also be understood that the presence and operation of the DAP in ATAP 702 is transparent to the conventional operation of the TAP to input TDI and TMS data and output TDO data when the TAP is enabled by the Local signal.

Figure 9:
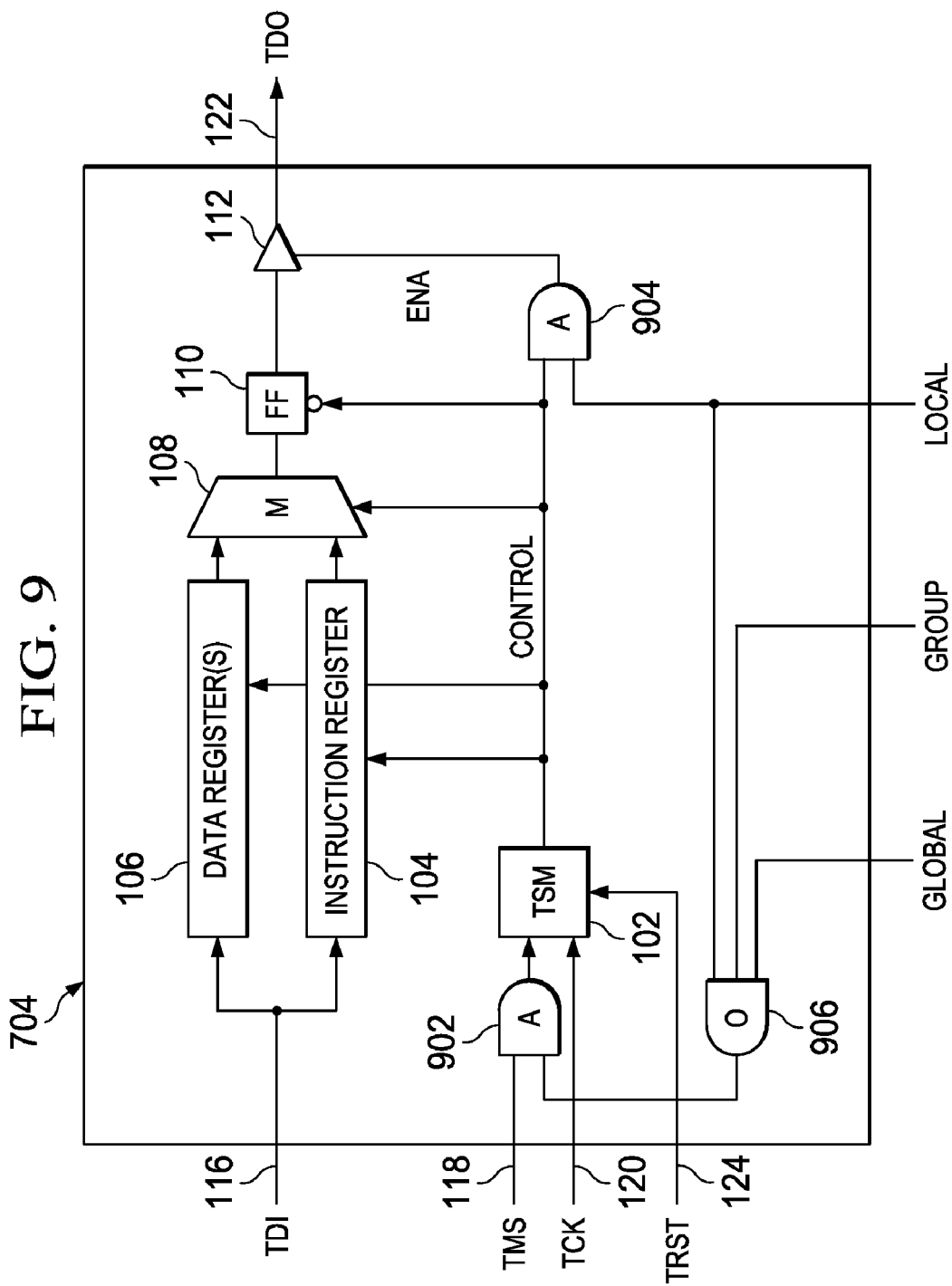
FIG. 9 illustrates a first example of how the TAP is adapted to interface with the device address port (DAP) of FIG. 7.

FIG. 9 illustrates a first example implementation of TAP 704 of FIG. 7 that uses the TMS signal to enable and disable the TAP 704. As mentioned, TAP 704 is the same as the conventional TAP 100 of FIG. 1 with the exception that it has been adapted to interface to the DAP's Global, Group and Local enable signals. The adaptation circuitry includes; (1) an AND gate 902 inserted into the TMS 118 signal path to TSM 102, (2) an AND gate 904 inserted into the TDO output buffer 112 enable (ENA) signal path from TSM 102, and (3) an OR gate 906 having an output to And gate 902 and inputs from the DAP's Global, Group and Local signals. Also the TSM's TRST input is coupled to the TRST output from DAP 706.

When the Global, Group and Local signals from DAP 706 are low, OR gate 902 applies a low to the input of AND gate 902 to disable the TMS signal from being input to TSM 102, which disables the operation of TAP 704. Also when the Local signal is low, AND gate 904 is disabled from passing the TDO enable (ENA) signal from TSM 102 to the TDO output buffer 122, which forces buffer 112 to a disabled state. In this condition, the TAP 704 is not addressed and is not able to respond to the TDI, TMS and TCK input signals or to output data on TDO.

When either the Global or Group signal is high and the Local signal is low, OR gate 902 applies a high to the input of AND gate 902 to enable the TMS signal to be input to TSM 102, which enables the operation of TAP 704. In this condition the TAP 704 is addressed and is able to respond to TDI, TMS and TCK input signals but cannot output data on TDO.

When the Local signal is high and the Global and Group signals are low, OR gate 902 applies a high to the input of AND gate 902 to enable the TMS signal to be input to TSM 102, which enables the operation of TAP 704. Also when the Local signal is high, AND gate 904 is enabled to pass the TDO ENA signal from TSM 102 to TDO buffer 112. In this condition the TAP 704 is addressed and is able to conventionally respond to TDI, TMS and TCK input signals and out data on TDO.

Figure 10:
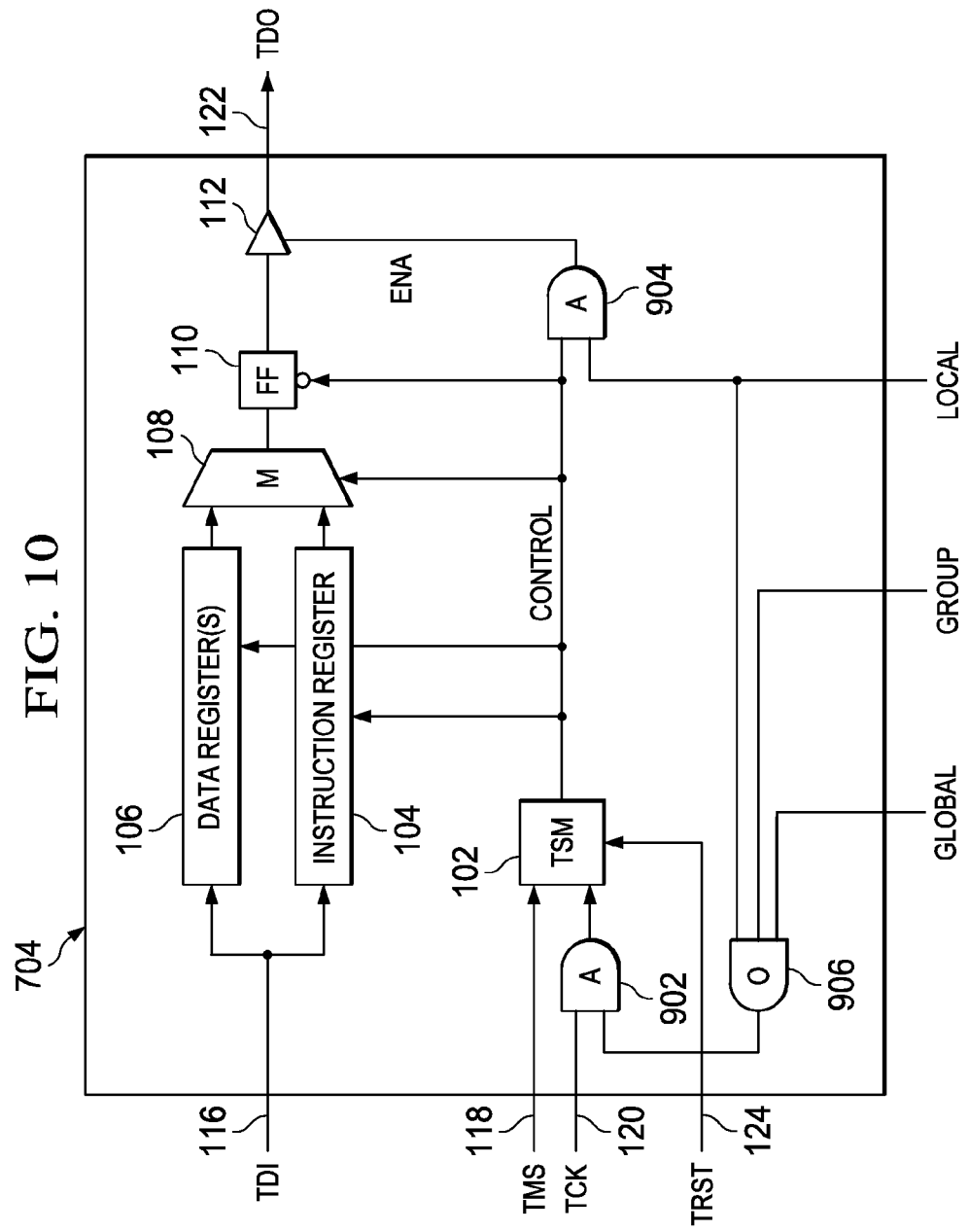
FIG. 10 illustrates a second example of how the TAP is adapted to interface with the device address port (DAP) of FIG. 7.

FIG. 10 illustrates a second example implementation of TAP 704 of FIG. 7 that uses the TCK signal to enable and disable the TAP 704. As mentioned, TAP 704 is the same as the conventional TAP 100 of FIG. 1 with the exception that it has been adapted to interface to the DAP's Global, Group and Local enable signals. The adaptation circuitry includes; (1) an AND gate 902 inserted into the TCK 120 signal path to TSM 102, (2) an AND gate 904 inserted into the TDO output buffer 112 enable (ENA) signal path from TSM 102, and (3) an OR gate 906 having an output to And gate 902 and inputs from the DAP's Global, Group and Local signals. Also the TSM's TRST input is coupled to the TRST output from DAP 706.

The enable (addressed) and disable (not addressed) modes of TAP 704 of FIG. 10 in response to the Global, Group and Local signals from DAP 706 are the same as that described in FIG. 9. The only difference is that the TCK signal of FIG. 10 is gated on and off to enable and disable the TAP instead of using the TMS signal as described in FIG. 9. The decision of using the gated TMS TAP implementation of FIG. 9 or the gated TCK TAP implementation of FIG. 10 is a design choice.

Figure 11:
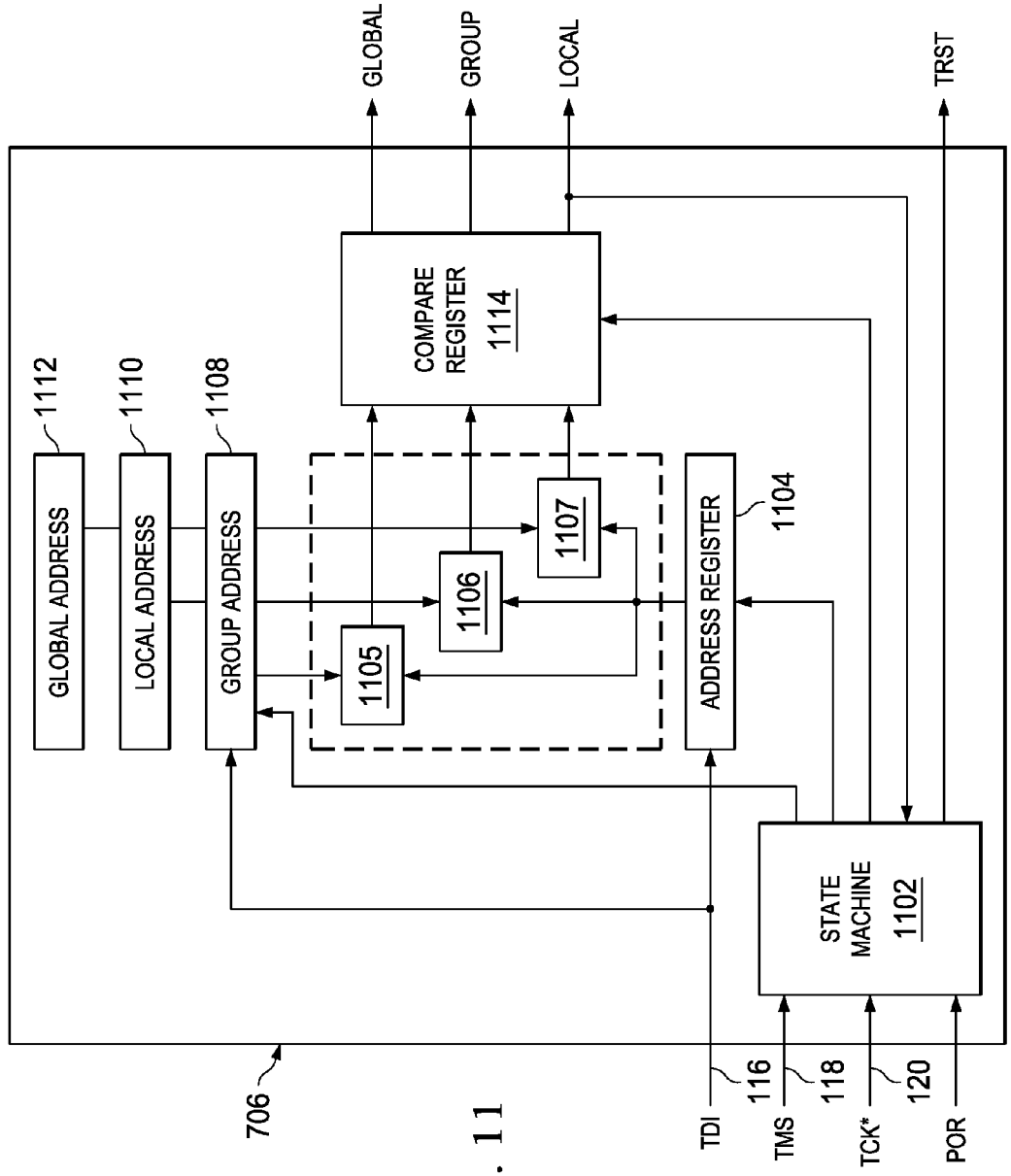
FIG. 11 illustrates an example implementation of the device address port (DAP) of FIG. 7.

FIG. 11 illustrates and example implementation of DAP 706 which consists of a state machine 1102, address register 1104, Group address comparator 1105, Local address comparator 1106, Global address comparator 1107, Group address register 1108, Local address circuit 1110, Global address circuit 1112 and a compare register 1114. State machine 1102 receives the TMS 118 input, an inverted TCK input (TCK*) 120, a power on reset (POR) signal, and the Local signal output from compare register 1114. State machine 1112 outputs control to the address register 1104, Group address register 1108, compare register 1114, and a TRST signal to TAP 704. Address register 1104 inputs the TDI signal and control signals from state machine 1102 and outputs parallel address data to address comparators 1105-1107. Group address register 1108 inputs the TDI signal and control signals from state machine 1102 and outputs parallel address data to Group address comparator 1105. Local address circuit 1110 outputs a fixed parallel address to Local address comparator 1106. Global address circuit 1112 outputs a fixed parallel address to Global address comparator 1107. The compare register 1114 inputs the compare result outputs from the Group, Local and Global comparators, control input from state machine 1102, and outputs a registered version of the Group, Local and Global compare result outputs.

The Global address circuit 1112 is set to a fixed address that is common to all device ATAPs 702. The Global address is a unique address that is reserved for the purpose of selecting (addressing) all device ATAPs 702 in a parallel arrangement such that they all respond to TCK and TMS inputs to transition together through the TAP state diagram of FIG. 3. As previously mentioned in regard to FIGS. 9 and 10, device ATAPs that are Globally addressed cannot output data on TDO.

The Local address circuit 1110 is set to a fixed address that is common to only one device ATAP 702. The Local address is reserved for selecting (addressing) only one particular device ATAP 702 in a parallel arrangement of device ATAPs such that only the selected device ATAP will respond to TCK and TMS inputs to transition through the TAP state diagram of FIG. 3. As previously mentioned in regard to FIGS. 9 and 10, a device ATAP that is Locally addressed can output data on TDO.

The Group address register 1108 is a register that can be loaded with a Group address input from TDI. Once the Group address registers 1108 of a selected subset group of parallel arranged device ATAPs 702 are loaded with a common Group address they can be selected (addressed) by the Group address to respond to TCK and TMS to transition together through the TAP state diagram of FIG. 3. Device ATAPs that do not contain the Group address will not transition with the Grouped device ATAPs. As previously mentioned in regard to FIGS. 9 and 10, device ATAPs that are Group addressed cannot output data on TDO.

In addition to the Global, Group and Local addresses, a No-Select address can be used, such as an all zeros address. ATAPs 702 will not respond to the No-Select address. The No-select address is useful when it is desired to input an address to deselect all ATAPs 702.

Figure 12:
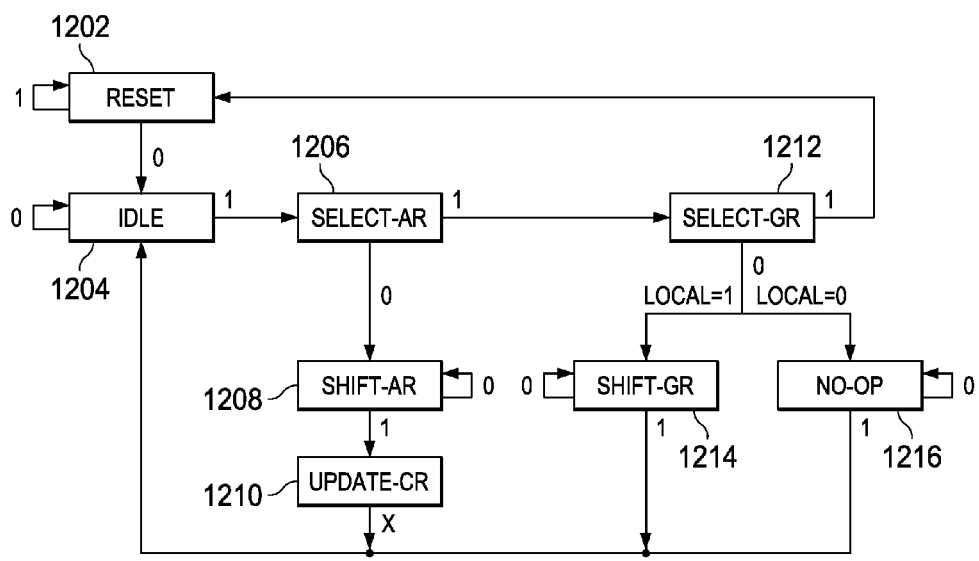
FIG. 12 illustrates an example state diagram for the state machine of the DAP of FIG. 11.

FIG. 12 illustrates an example state diagram depicting the operation of state machine 1102. The state machine responds to TMS input 118 to transition through its states on the rising edge of the inverted TCK input (TCK*) 120. In response to a POR input, the state machine transitions to Reset state 1202. The state machine remains in the Reset state while TMS is high. In the Reset state, the state machine outputs the TRST signal to reset ATAP 702 to the Test Logic Reset state of FIG. 3 and outputs reset signals to reset the Address register 1104, Group address register 1108 and Compare register 1114. The Address and Group registers are reset to an address that is not recognized or used to select any device ATAP 702, such as the No-Select address mentioned above. The Compare register 1114 is reset to output logic lows on the Global, Group and Local enable signals, which disables TAP 704.

In response to a low on TMS, state machine 1102 transitions from Reset state 1202 to Idle state 1204 and sets the TRST and other reset signals to the non-reset state. State machine 1102 remains in Idle state 1204 while TMS is low. In response to a high on TMS, state machine 1102 transitions to select address register (Select-AR) state 1206. Depending on the logic level of TMS, the state machine transitions to either the select group register (Select-GR) state 1212 (TMS=1) or to shift address register (Shift-AR state 1208 (TMS=0). The following describe the result of these two transitions.
(1) Result of Select-AR to Shift-AR Transition If state machine 1102 transitions from Select-AR state 1206 to Shift-AR state 1208, the state machine outputs control to Address register 1104 causing the Address register to shift in an address from TDI. This shift operation loads an address into Address register 1104 that will be compared against the Global, Group and Local addresses via comparators 1105-1107. The shift operation will occur while TMS is low. When the shift operation is complete TMS goes high causing state machine 1102 to transition to the update compare register (Update-CR) state 1210. In Update-CR state 1210 the state machine outputs control to Compare register 1114 to store the Global, Group and Local compare result outputs from comparators 1105-1107. If the address in the Address register matches the Global address, the Global output from Compare register 1114 will be set high, If the address in the Address register matches the Group address, the Group address output from Compare register 1114 will be set high. If the address in the Address register matches the Local address, the Local address output from Compare register 1114 will be set high. If the address in the Address register does not match the Global, Group or Local address, the outputs from Compare register 1114 will be set low. The state machine transitions from the Update-CR state 1210 to the Idle 1204.
(2) Result of Select-AR to Shift-GR Transition If state machine 1102 transitions from Select-AR state 1206 to the select group register (Select-GR) state 1212, there are two transitions that can occur; (1) transition to the Reset state 1202 if TMS is high or (2) transition to the shift group (Shift-GR) or no-operation (No-Op) states 1214 and 1216 if TMS is low. If TMS is high, the state machine transitions from the Select-GR state 1212 to Reset state 1202 and asserts reset conditions on the reset and TRST signals as mentioned above, to reset the TAP 704 and DAP circuits 1104, 1108 and 1114. If TMS is low, the state machine transitions from Select-GR state 1212 to Shift-GR state 1214 if the Local signal from Compare register 1114 is high or to the No-Op state 1216 if the Local signal is low. The Local signal is used to enable a device ATAP to be loaded with a Group address. If the Local signal of an ATAP is high, it has been previously selected to input the Group address. If the Local signal of an ATAP is low, it has not been previously selected to input the Group address.

Assuming the Local signal is high the transition from Select-GR state 1212 to Shift-GR state 1214 will cause the state machine to output control to the Group address register to input the Group address from TDI. The state machine will remain in the Shift-GR state while TMS is low. When TMS goes high, the Group address input is complete and the state machine transitions from Shift-GR state 1214 to Idle state 1204.

Assuming the Local signal is low the state machine will transition from Select-GR state 1212 to No-Op state. The state machine will remain in the No-Op state while TMS is low and no action will occur in the DAP. The No-Op state is a state that is used to allow non-selected ATAPs to remain synchronized with the TMS and TCK bus signals controlling an ATAP that has been previously selected (Local=1) and is inputting the Group address in Shift-GR state 1214. The No-Op state is a non-operation state that is substitutes for the Shift-GR state when the Local signal of an ATAP is low. When TMS goes high, the Group address input operation is complete and the state machine transitions from No-Op state 1216 to Idle state 1204.

As seen in the example state diagram if FIG. 12, the state machine has been designed to transition to Reset state 1202 from any of its states in 5 TCKs or less if the TMS signal is set high. This means state machine 1102 will always transition to (i.e. return) to Reset state 1202 whenever TCK is active and the TMS signal is set high. This reset state return feature mimics the "return to reset" feature of the conventional 1149.1 TAP's TSM 102 which was designed to return to the Test Logic Reset state of FIG. 3 within 5 TCKs or less from any state in the diagram if TMS is set high. Thus the "return to reset" feature of the ATAP is advantageously identical to the "return to reset" feature of the conventional TAP's TSM 102.

It should be noted that while the state diagram of FIG. 12 is use to illustrate the operation of state machine 102, the operation of state machine 102 is not limited to this particular state diagram. Indeed other state diagrams could be devised to implement the operation of state machine 102 without departing from the spirit of the present disclosure.

Figure 13:
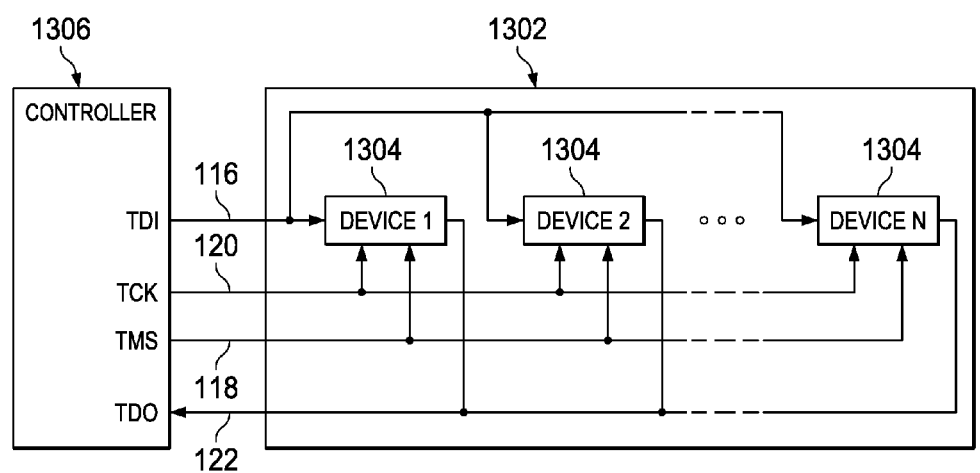
FIG. 13 illustrates a parallel arrangement of devices with ATAPs being connected to a controller, according to the disclosure.

FIG. 13 illustrates an example configuration of the disclosure whereby an electronic system 1302 contains multiple devices 1304, each device containing an ATAP 702 and each ATAP is connectable in a parallel arrangement to a JTAG controller 1306 as shown. The electronic system 1302 could be a board or other substrate and the devices 1304 could be packaged or unpackaged ICs on the board or other substrate. Also, the electronic system 1302 could be an IC and the devices 1304 could be embedded core circuits within the IC. Furthermore, the electronic system 1302 could be an embedded core within an IC and the devices 1304 could be core circuits within the embedded core.

As seen in FIG. 13, the controller 1306 is; (1) connected to each device ATAP TDI input signal 116 for inputting data, (2) connected to each device ATAP TCK input signal 120 for inputting clocks, (3) connected to each device ATAP TMS input signal 118 for inputting mode signals, and (4) connected to each device ATAP TDO output signal 122 for receiving data.

Figure 5:
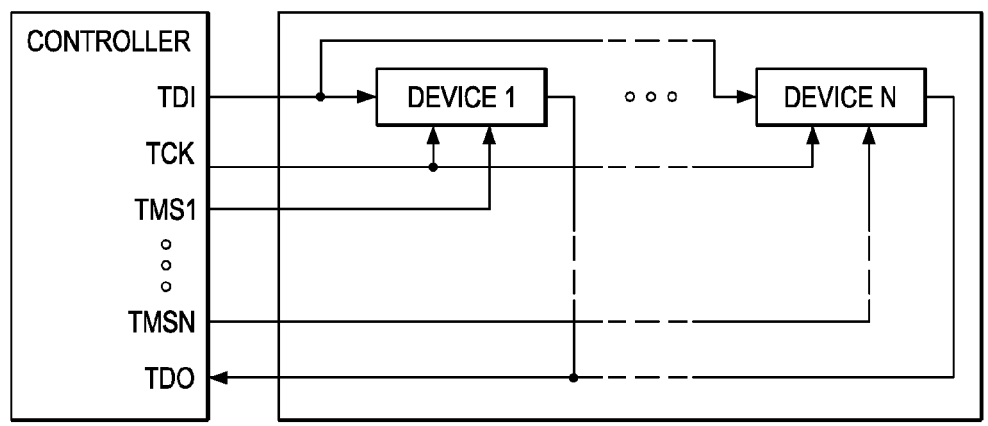
FIG. 5 illustrates a conventional parallel arrangement between a controller and multiple device TAPs.

The parallel arrangement of device ATAPs 702 to controller 1306 of FIG. 13 is similar to the parallel arrangement of device TAPs 100 connected to the controller of FIG. 5 with the exception that only one TMS 118 signal is required in FIG. 13 as opposed to multiple (1-N) TMS signals 118 being required in FIG. 5. Also the controller 1306 is similar to the controller of FIG. 5 with the exception that it has only one TMS output signal and it has been designed to input two data signals on the TDI and TMS per TCK period. One of the data signals on TDI and TMS is for input to the ATAP's TAP 704 and the other data signals on TDI and TMS is for input to the ATAP's DAP 706, as previously described in the timing diagram of FIG. 8.

When the electronic system 1302 is powered up, none of the device ATAP's 1304 will be selected (addressed) for access by the controller. To access a particular device ATAP 1304 the controller will use Local addressing. To access a subset group of device ATAPs 1304 the controller will use Group addressing. To access all of the device ATAP's 1304 the controller will use Global addressing.

FIG. 13A illustrates the steps involved in using the Local address to select one of the device ATAPs 1304 of FIG. 13. The steps involve inputting a Local address to select one of the device ATAPs 1304 then accessing the TAP 704 of the selected device ATAP 1304. The device ATAP that matches the Local address will enable its TAP 704 so that it can be accessed by the controller. During Local access, the TAP 704 of the addressed device ATAP responds to TCK and TMS transition through the states of the TAP state diagram of FIG. 3. If the TAP transitions into the Shift-DR or Shift-IR states of FIG. 3, the controller can input data to the TAP via TDI and receive data from the TAP via TDO. Access to another device ATAP 1304 is accomplished by repeating the above steps of inputting a Local address to select a device ATAP followed by accessing the TAP of the selected device ATAP.

FIG. 13B illustrates the steps involved in using the Group address to select a subset group of device ATAPs of FIG. 13 for access. The steps involve inputting a Local address to select one of the device ATAPs then inputting a Group address into the selected device ATAP. These steps are repeated on all other device ATAPs that are to be Group addressed. After all device ATAPs of a group have been selected and loaded with the Group address, the controller inputs the Group address to all device ATAPs 1304. Only the TAPs 704 of device ATAPs that have been loaded with the Group address are enabled to respond to the TCK and TMS input from the controller to transition through the states of the TAP state diagram of FIG. 3. The TAPs 704 of the grouped device ATAPs may also input data from the controller via the TDI input 116 but cannot output data to the controller on TDO output 122 since it is disabled by the Group address. Access to another group of device ATAP 1304 is accomplished by repeating the above steps of inputting the Local address to select a TAP followed by loading the Group address into the selected ATAP and repeating these steps on other ATAP that are to be grouped. The Group address is useful in selecting a group of ATAPs 1304 and moving their TAPs 704 to a desired state of the TAP state diagram of FIG. 3.

Figure 3:
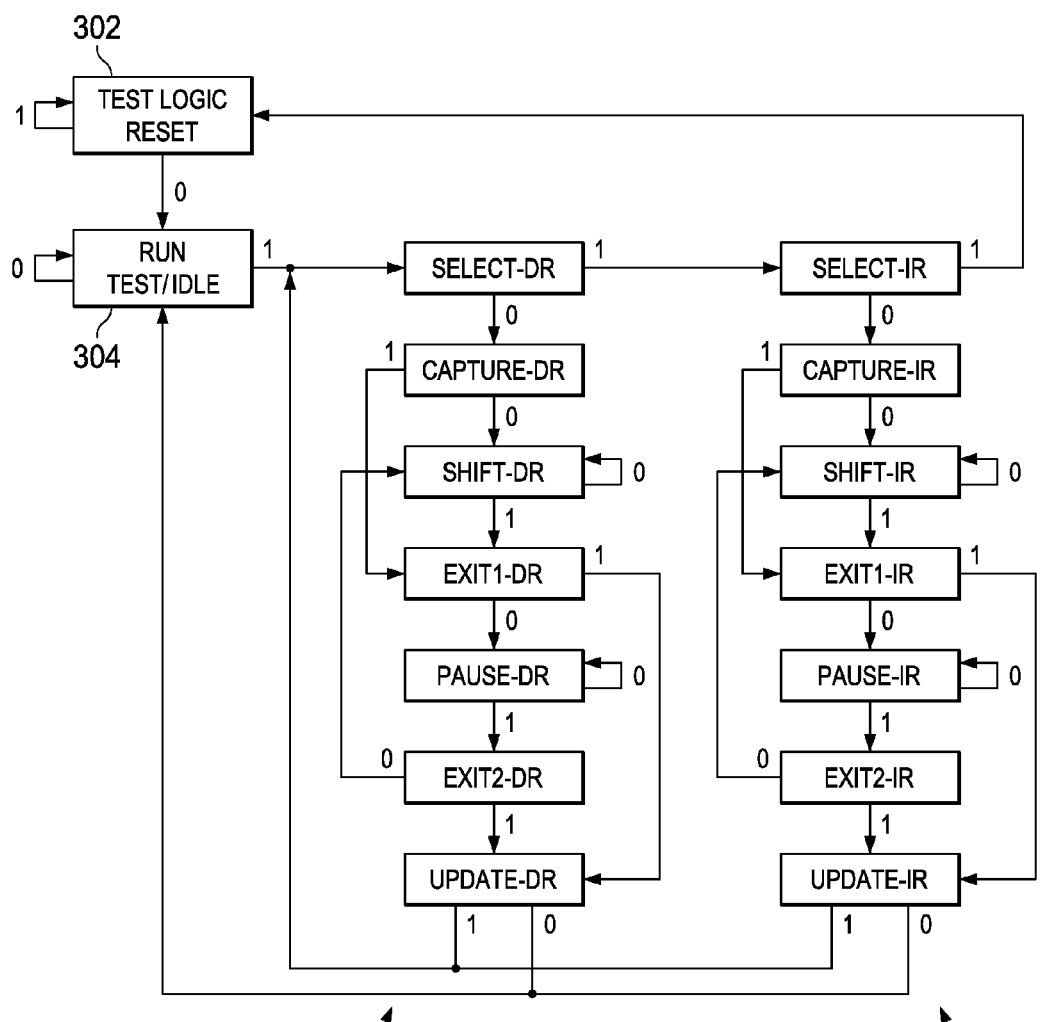
FIG. 3 illustrates the timing diagram of the state machine of a conventional 1149.1 TAP.
Figure 4:
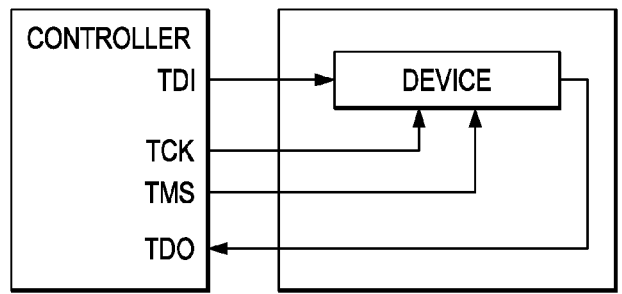
FIG. 4 illustrates a conventional connection between a controller and one device TAP.

In a first example of moving TAPs to a desired state, the TAPs of a group of ATAPs may be moved from the Run Test/Idle state to the Test Logic Reset state of FIG. 3 to reset the TAPs of that group. In a second example, the TAPs of a group of ATAPs may be moved from the Run Test/Idle state to the Pause-DR or Pause-IR state of FIG. 3. In a third example, the TAPs of a group of ATAPs may be moved from the Pause-DR or Pause-IR to the Run Test/Idle state of FIG. 3. In a fourth example, the TAPs of a group of ATAPs may be moved from the Pause-DR state to the Pause-IR state or from the Pause-IR state to Pause-DR state of FIG. 3. While these four TAP state movement examples are mentioned, grouped TAPs may be moved from any state of FIG. 3 to any other state of FIG. 3. It should be noted that the Local address can be similarly used to move an individual TAP from one state of FIG. 3 to another state of Figure.

Using the present disclosure, it is possible to setup more that one group of ATAPs. This is accomplished by using the above steps to establish a first group of ATAPs using a first Group address, then using the above steps to establish a second group of ATAPs using a second Group address. Access to the first group of ATAPs occurs in response to inputting the first Group address and access to the second group of ATAPs occurs in response to inputting the second Group address. The first and second Group of TAPs can be individually selected and positioned in the same or different TAP states of FIG. 3.

Grouped TAP state movement is important in a variety of device operations, such as device test, debug, trace and programming operations. One example of grouped TAP state movement is to select a group of TAPs that are in say the Run Test/Idle state of FIG. 3 and transition them to the Pause-DR state of FIG. 3. Once in the Pause-DR state, each TAP is individually addressed, using its Local address, and controlled to perform a data register shift operation by transitioning from the Pause-DR state to the Shift-DR state via the Exit2-DR state of FIG. 3, then back to the Pause-DR state via the Exit1-DR state of FIG. 3. The TDO of the Locally addressed TAP becomes active during the shift operation to output data to the controller. After each TAP in the group has been locally addressed and controlled to perform a data register shift operation, a Group address is issued to cause all the TAPs to transition together through the Update-DR state of FIG. 3. Simultaneously transitioning the TAPs through the Update-DR state causes all the TAPs to update the outputs of their data registers that have been shifted during the individual data register shift operations mentioned above. This individual shifting and simultaneous updating of data registers is particularly important when performing JTAG boundary scan operations between the devices of FIG. 13 since it allows the outputs of the device boundary scan data register to be updated at the same time.

Another example of grouped TAP state movement is to select a group of TAPs that are in say the Run Test/Idle state of FIG. 3 and transition them to the Pause-IR state of FIG. 3. Once in the Pause-IR state, each TAP is individually addressed, using its Local address, and controlled to perform an instruction register shift operation by transitioning from the Pause-IR state to the Shift-IR state via the Exit2-IR state of FIG. 3, then back to the Pause-IR state via the Exit1-IR state of FIG. 3. The TDO of the Locally addressed TAP becomes active during the shift operation to output data to the controller. After each TAP in the group has been locally addressed and controlled to perform an instruction register shift operation, a Group address is issued to cause all the TAPs to transition together through the Update-IR state of FIG. 3. Simultaneously transitioning the TAPs through the Update-IR state causes all the TAPs to simultaneously update the outputs of their instruction registers. Simultaneously updating device instruction registers is important since it allows all the device instructions to take effect at the same time.

FIG. 13C illustrates the steps involved in using the Global address to select all the device ATAPs 1304 of FIG. 13. The steps involve inputting the Global address to select all device ATAPs then accessing the TAPs 704 of all device ATAPs 1304. During Global access, the TAPs 704 of all device ATAPs respond to TCK and TMS to move through the states of the TAP state diagram of FIG. 3. The TAPs 704 of the device ATAPs may also input data from the controller via the TDI input 116 but cannot output data to the controller on TDO output 122 since it is disabled by the Global address.

Global TAP state movement is important in a variety of device operations. One example is to use the Global address to select all device TAPs of FIG. 13 to respond to TCK and TMS to move together from one state of the TAP diagram of FIG. 13 to another state of the TAP diagram of FIG. 13. For instance the Global address can be used to select all device TAPs of FIG. 13 to move out of the Test Logic Reset state of FIG. 3 to another state of FIG. 3 in preparation for a test, debug, trace or programming operation. At the end of the test, debug, trace or programming operation, the Global address can again be used to select all device TAPs of FIG. 3 and move them back into the Test Logic Reset state of FIG. 3.

Another example is to use the Global address to select all TAPs that are in say the Test Logic Reset state of FIG. 3 and transition them to the Pause-IR state of FIG. 3. Once in the Pause-IR state, each TAP is individually addressed, using its Local address, and controlled to perform an instruction register shift operation by transitioning from the Pause-IR state to the Shift-IR state via the Exit2-IR state of FIG. 3, then back to the Pause-IR state via the Exit1-IR state of FIG. 3. The TDO of the Locally addressed TAP becomes active during the shift operation to output data to the controller. After all TAPs have been locally addressed and controlled to perform an instruction register shift operation, a Global address is issued to cause all the TAPs to transition together through the Update-IR state of FIG. 3. Transitioning the TAPs through the Update-IR state causes all the TAPs to update the outputs of their instruction registers. Thus the instructions loaded into each device TAP of FIG. 13 advantageously take effect at the same time.

A further example is to use the Global address to select all TAPs that are in say the Run Test/Idle state of FIG. 3 and transition them to the Pause-DR state of FIG. 3. Once in the Pause-DR state, each TAP is individually addressed, using its Local address, and controlled to perform a data register shift operation by transitioning from the Pause-DR state to the Shift-DR state via the Exit2-DR state of FIG. 3, then back to the Pause-DR state via the Exit1-DR state of FIG. 3. The TDO of the Locally addressed TAP becomes active during the shift operation to output data to the controller. After all TAPs have been locally addressed and controlled to perform a data register shift operation, a Global address is issued to cause all the TAPs to transition together through the Update-DR state of FIG. 3. Transitioning all the TAPs through the Update-DR state causes all the TAPs to simultaneously update the outputs of their data registers. Thus the data loaded into data registers of the device TAPs of FIG. 13 is advantageously updated at the same time.

The ATAP 702 is unique in its TAP selection capability compared to other known methods of selecting TAPs for access, which include but are not limited to Texas Instruments Addressable Scan Port 8996 device and National Semiconductor's ScanBridge STA112 device. These other TAP selection techniques/devices can only select or deselect TAPs for access by a controller when the TAP state diagram of FIG. 3 is in the Run Test/Idle state, Pause-DR state or Pause-IR state. The ATAP 702 of the present disclosure can select or deselect a TAP in these states or in any other state of the state diagram of FIG. 3. The reason the ATAP can select or deselect TAPs in any of the FIG. 3 state diagram states is that the TAP 704 and DAP 706 of FIG. 7 are separate circuits that operate independent of each other in response to the TCK 120 and TMS 118 inputs. As previously described, the ATAP's TAP 704 responds to TMS on the rising edge of TCK and the ATAP's DAP 706 responds to TMS on falling edge of TCK. The TMS signal controls TAP's TSM 102 to operate according to the FIG. 3 state diagram and the TMS signal controls the DAP's state machine 102 to operate according to the FIG. 12 state diagram. Since the TAP TSM 102 and DAP state machine 1102 receive different inputs on TMS, their operations are completely independent from one another, as will be described in FIGS. 14A-14D below.

Figure 14A:
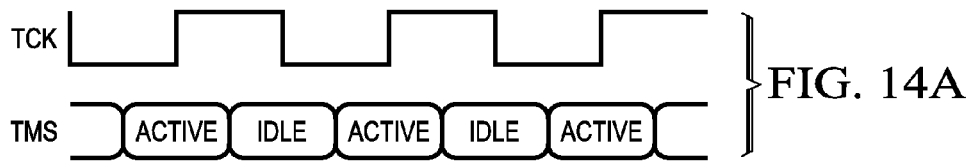
FIG. 14A illustrates the timing of accessing an ATAP's TAP without accessing the ATAP's DAP.

FIG. 14A illustrates the TCK and TMS inputs to ATAP 702. As seen in this example, the TAP is receiving TMS signals on the rising edge of TCK that make the TAP's TSM 102 Active, and the DAP is receiving TMS signals on the falling edge of TCK that make the DAP's state machine Idle. The Active TMS inputs to the TAP causes the TAP's TSM 102 to transition through the states of FIG. 3 to execute an operation, for example a data or instruction scan operation. The Idle TMS inputs to the DAP causes the DAP's state machine 1102 to be idle in one of the holding states of FIG. 12, for example the Reset, Idle, Shift-AR, Shift-GR or No-Op states.

Figure 14B:
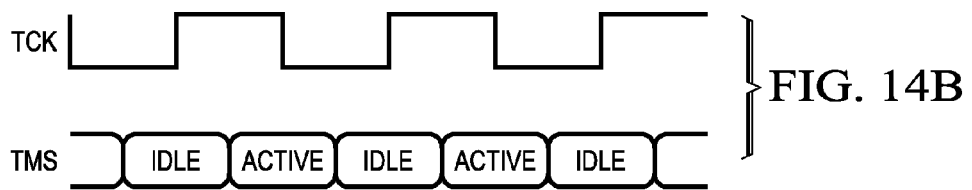
FIG. 14B illustrates the timing of accessing an ATAP's DAP without accessing the ATAP's TAP.

FIG. 14B illustrates the TCK and TMS inputs to ATAP 702. As seen in this example, the TAP is receiving TMS signals on the rising edge of TCK that make the TAP's TSM 102 Idle, and the DAP is receiving TMS signals on the falling edge of TCK that make the DAP's state machine Active. The Active TMS inputs to the DAP causes the DAP's state machine 1102 to transition through the states of FIG. 12 to execute an operation, for example a shift address register (Shift-AR) or shift group register (Shift-GR) operation. The Idle TMS inputs to the TAP causes the TAP's TSM 102 to be idle in one of the holding states of FIG. 3, for example the Test Logic Reset, Run Test/Idle, Shift-DR, Shift-IR, Pause-DR or Pause-IR states.

Figure 14C:
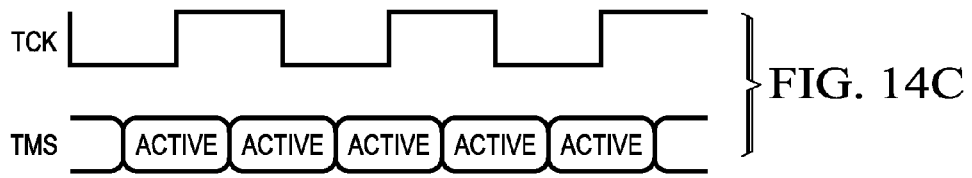
FIG. 14C illustrates the timing of accessing an ATAP's TAP and DAP.

FIG. 14C illustrates the TCK and TMS inputs to ATAP 702. As seen in this example, the TAP is receiving TMS signals on the rising edge of TCK that make the TAP's TSM 102 Active, and the DAP is receiving TMS signals on the falling edge of TCK that make the DAP's state machine Active. The Active TMS inputs to the TAP causes the TAP's TSM 102 to transition through the states of FIG. 3 to execute an operation, for example a data or instruction scan operation. The Active TMS inputs to the DAP causes the DAP's state machine 1102 to transition through the states of FIG. 12 to execute an operation, for example a shift address register (Shift-AR) or shift group register (Shift-GR) operation.

Figure 14D:
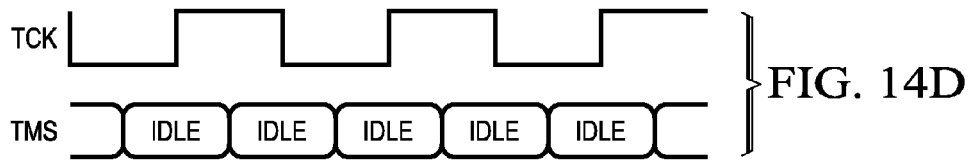
FIG. 14D illustrates the timing of not accessing either the ATAP's TAP or DAP.

FIG. 14D illustrates the TCK and TMS inputs to ATAP 702. As seen in this example, the TAP is receiving TMS signals on the rising edge of TCK that make the TAP's TSM 102 Idle and the DAP is receiving TMS signals on the falling edge of TCK that make the DAP's state machine 1102 Idle. The Idle TMS inputs to the TAP and DAP causes their state machines to be idle in one of the previously mentioned holding states of FIGS. 3 and 12 respectively.

Figure 15A:
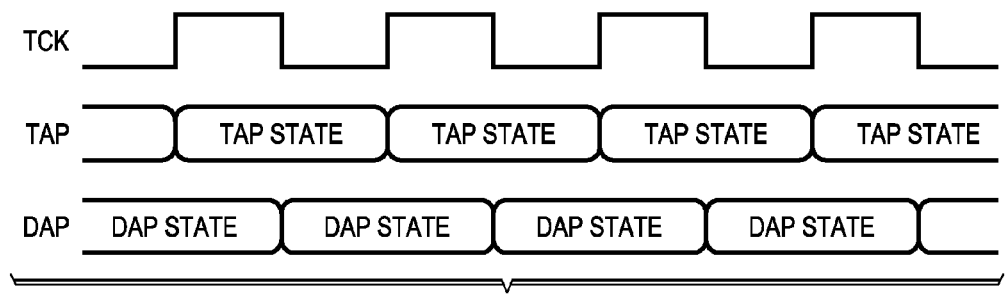
FIG. 15A illustrates the timing of transition the ATAP's TAP and DAP through states.

FIGS. 15A-15C are provided to illustrate how the DAP 706 can be used to enable or disable the TAP 704 in any one of the 16 states of the TAP state diagram of FIG. 3.

FIG. 15A illustrates an example of the TAP actively transitioning through its states on the rising edge of TCK and the DAP actively transitioning through its states on the falling edge of TCK. The TAP could be transitioning through any state sequence of the state diagram of FIG. 3, and the DAP could be transitioning through any state sequence of the state diagram of FIG. 12.

FIG. 15B illustrates an example whereby the TAP 704 is currently Disabled in one of the 16 states of the TAP state diagram of FIG. 3. The TAP is disabled since none of the Global, Group or Local enable signals, indicated by Enable signal 1502, from the DAP are set high. The Enable signal 1502 represents the output of OR gate 906 of FIG. 9. Also in FIG. 15B, the DAP 706 is in the process of completing a shift address register operation in Shift-AR state 1208 to load an address into the DAP's Address register 1104, as previously described in regard to FIGS. 11 and 12. In this example the loaded address will match one the DAP's Global, Group or Local addresses of FIG. 11 and set the matching Global, Group or Local signal high. At the end of the shift address register operation, the DAP enters the Update-CR state 1210 on the falling edge of TCK 1504 to update compare register 1114. On the falling edge of TCK 1506, the compare register 1114 is updated and outputs a high on the matching Global, Group or Local signal, which in turn sets Enable signal 1502 high. The high on Enable signal 1502 will enable the TAP 704 to respond to the rising edge of TCK 1508 by either gating on the TAP's TMS or TCK signal as described in regard to FIG. 9 or 10.

FIG. 15C illustrates an example whereby the TAP 704 is currently enabled and operating according to the state diagram of FIG. 3. The TAP is enabled since the Enable signal 1502 (output of OR gate 906) is set high. Also in FIG. 15C, the DAP 706 is in the process of completing a shift address register operation in the Shift-AR state 1208 to load an address into the DAP's Address register 1104, as previously described in regard to FIGS. 11 and 12. In this example the loaded address will not match one the DAP's Global, Group or Local addresses and will therefore cause the Enable 1502 signal to be set low. At the end of the shift address register operation, the DAP enters the Update-CR state 1210 on the falling edge of TCK 1510 to update compare register 1114. On the falling edge of TCK 1512, the compare register 1114 is updated and will output lows (no address match) on the Global, Group and Local signals, which in turn sets Enable signal 1502 low. The low on Enable signal 1502 will disable the TAP 704 from responding to the rising edge of TCK 1514 and subsequent rising TCK edges by either gating off the TAP's TMS or TCK signal as described in regard to FIG. 9 or 10.

As can be seen in FIG. 15C above, the TAP 704 can become disabled by the DAP during any desired one of its states shown in the TAP state diagram of FIG. 3. This is done simply by aligning or synchronizing if you will the operation of the DAP with the operation of the TAP such that the occurrence of the DAP's Update-CR state 1210, at the end of an address input operation to address register 1104, occurs such that the Enable signal 1502 is set low in the TAP state that the TAP is to be disable in. For example, in FIG. 15C, the desired TAP disable state is Enable state 1516. Thus the occurrence of the Update-CR state is aligned such that the Enable signal is set low while the TAP is in Enable state 1516. The Enable state 1516 could be any one of the 16 TAP states shown in the state diagram of FIG. 3. The TAP will remain disabled in the desire state until it is again enabled by the DAP as shown in FIG. 15B.

From the above description it is clear that the DAP 706 can disable and enable TAP 704 in any desired TAP state. Thus the present disclosure provides a much improved TAP disable and enable control mechanism than the previously mentioned other TAP disable/enable techniques and devices, since they can only disable and enable a TAP when the TAP is in the Run Test/Idle, Pause-DR or Pause-IR states of the state diagram of FIG. 3.

Selectable Serial or Parallel TAP Access

While the present disclosure has in detail a novel way to allow TAPs in a parallel arrangement to be selected and accessed individually, in groups, or globally, not all TAP applications will be arranged in parallel. Indeed some TAP applications will be conventionally arranged serially. As described below, the disclosure comprehends the benefits of both the parallel and serial arrangements and is extended herein to support both arrangements.

Figure 6:
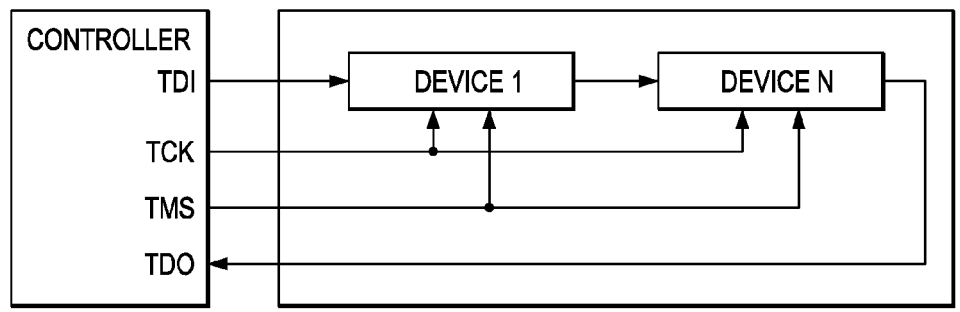
FIG. 6 illustrates a conventional serial arrangement between a controller and multiple device TAPs.
Figure 16:
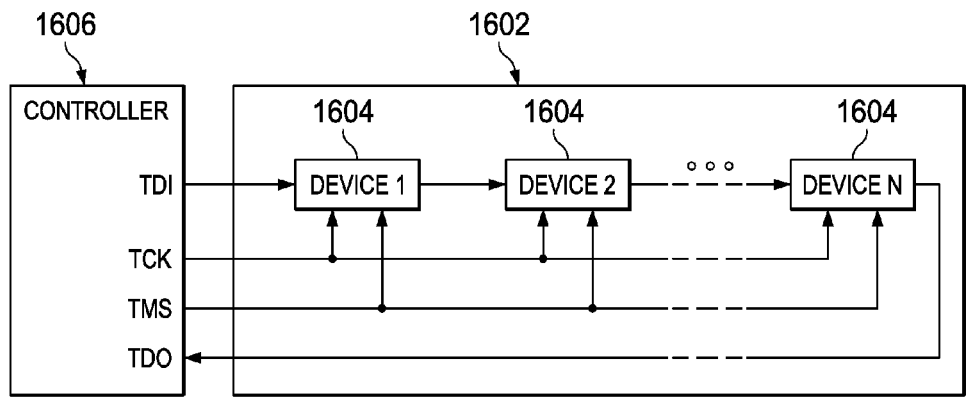
FIG. 16 illustrates an example electronic system whereby a serial arrangement of device TAPs are accessed conventionally by a controller.

FIG. 16 illustrates an electronic system 1602, such as a board, IC or embedded core circuit within an IC, that includes a serial arrangement of devices 1-N 1604 with conventional TAPs 100 coupled to a controller 1606. For a board 1602, the devices 1604 are assumed to be ICs on the board 1602. For an IC 1602, the devices 1604 are assumed to be embedded cores within the IC 1602. For an embedded core circuit 1602, the devices 1604 are assumed to be embedded cores within the embedded core 1602. The device TAPs 100 of the serial arrangement can be accessed by the controller as previously described in regards to FIG. 6.

Figure 17:
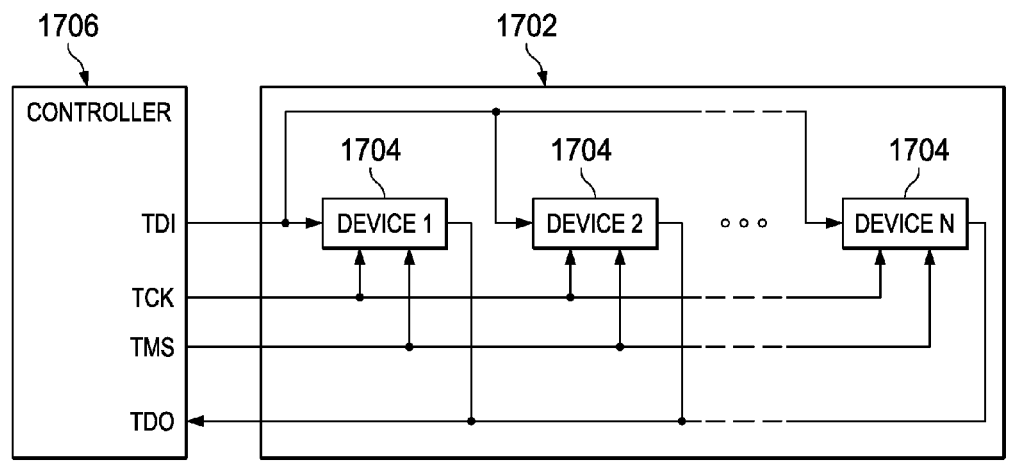
FIG. 17 illustrates an example electronic system whereby a parallel arrangement of device ATAPs are accessed by a controller according to the disclosure.

FIG. 17 illustrates an electronic system 1702, such as a board, IC or embedded core circuit within an IC, that includes a parallel arrangement of devices 1-N 1704 with ATAPs 702 coupled to a controller 1706. For a board 1702, the devices 1704 are assumed to be ICs on the board 1702. For an IC 1702, the devices 1704 are assumed to be embedded cores within the IC 1702. For an embedded core circuit 1702, the devices 1704 are assumed to be embedded cores within the embedded core 1702. The device ATAPs 702 of the serial arrangement can be accessed by the controller as previously described thus far by the present disclosure.

In FIG. 16, the devices 1-N 1604 are assumed to be in a first customer's electronic system 1602 (board or IC). In FIG. 17, the devices 1-N 1704 are assumed to be in a second customer's electronic system 1702 (board or IC). Further, device 1 of FIG. 16 is functionally the same as device 1 of FIG. 17. Likewise devices 2-N of FIGS. 16 and 17 are functionally same, respectively. For example devices 1 of FIGS. 16 and 17 could both be functionally identical DSPs, devices 2 of FIGS. 16 and 17 could both be functionally identical CPUs, and so on. It would be beneficial to the manufacturers of devices 1-N if the devices could be used in either the serial or parallel arrangements of FIG. 16 or 17. The benefit to the device manufacturers would be that they would not have to offer a first version of say device 1 with a TAP 100 that can be used by the first customer in the serial arrangement of FIG. 16 and a second version of device 1 with an ATAP 702 that can be used by the second customer in the parallel arrangement of FIG. 17. The following description illustrates how a device manufacturer can design an ATAP into a device (IC or core) that can selectively operate as a TAP 100 for use by the first customer in the serial arrangement of FIG. 16 or as an ATAP 702 for use by the second customer in the parallel arrangement of FIG. 17.

Figure 18A:
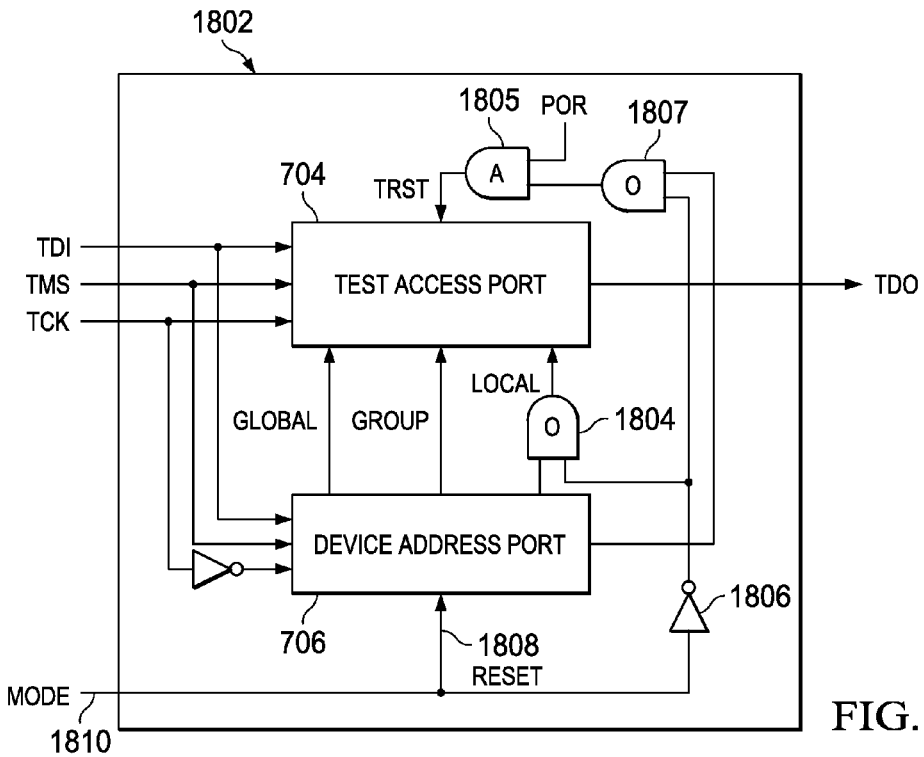
FIG. 18A illustrates a first example of how the ATAP can be adapted to allow the ATAP to operate in the serial arrangement of FIG. 16 or the parallel arrangement of FIG. 17.

FIG. 18A illustrates an example design of an ATAP 1802 within a device (IC or core) that can selectively operate as a conventional TAP 100 for use in electronic systems that use the serial arrangement of FIG. 16 or as an ATAP 702 of the present disclosure for use in electronic systems that use the parallel arrangement of FIG. 17. The ATAP 1802 is the same as ATAP 702 with the following exceptions. A Mode terminal 1810 has been added to the ATAP 1802 for inputting a Mode signal that is used to select the serial (FIG. 16) or parallel (FIG. 17) operation mode of the ATAP 1802. The Mode signal is input to the reset terminal of the Address Port 706 in place of the POR signal shown in FIG. 7. An OR gate 1804 has been inserted into the Local signal path between the Address Port 706 and TAP 704. The OR gate receives the Local signal output from Address Port 706 and an inverted Mode signal from inverter 1806. The output of the OR gate is input to the Local enable input of TAP 704. An OR gate 1807 and an AND gate 1805 are inserted into the TRST signal path between the Address Port 706 and TAP 704. The OR gate inputs the TRST signal from Address Port 706 and the inverted Mode signal from inverter 1806. The OR gate 1807 output is connected to one input of AND gate 1805 and a POR signal is input to the other input of AND gate 1805. The output of AND gate 1805 is input to the TRST input of TAP 704.

If the ATAP 1802 is to be used in a serial device arrangement within an electronic system, as shown in FIG. 16, the Mode terminal 1810 is set low. Setting Mode 1810 low disables the Address Port 706 into its Reset state 1202, forces a high on the Local signal input to TAP 704 from OR gate 1804, and forces a high on the TRST signal to AND gate 1805 from OR gate 1807. The POR signal input to AND gate 1805 is used to reset the TAP 704 when the device powers up by temporarily setting the TRST input signal to TAP 704 low. With the TAP 704 Local signal forced high, AND gate 902 of FIG. 9 or 10 is set to pass the TMS signal 118 or the TCK signal 120, respectively, to TSM 102, and AND gate 904 of FIG. 9 or 10 is set to pass the TDO enable signal (ENA) from TSM 102 to TDO buffer 112. As can be seen, with the Mode input terminal 1810 set low, the Address port 706 of ATAP 1802 is disabled and the TAP 704 of ATAP 1802 is enabled to operate as a conventional TAP 100. Thus by setting the Mode input 1802 to ATAP 1802 low, the ATAP 1802 is programmed to operate in the serial device arrangement of FIG. 16.

If the ATAP 1802 is to be used in a parallel device arrangement within an electronic system, as shown in FIG. 17, the Mode terminal 1810 is set high. Setting Mode 1810 high enables the ATAP 1802 to operate in its addressable mode as previously described in regard to ATAP 702.

If ATAP 1802 is an IC on a board, the Mode input 1810 will be available at an external IC pad so that it can be wired low to program the ATAP 1802 to operate as a conventional TAP 100 or wired high to program it to operate as an ATAP 702. Likewise, if ATAP 1802 is an embedded core within an IC, the Mode input 1810 will be available at an external core terminal so that it can be wired low to program the ATAP 1802 to operate as a conventional TAP 100 or wired high to operate as an ATAP 702.

Figure 18B:
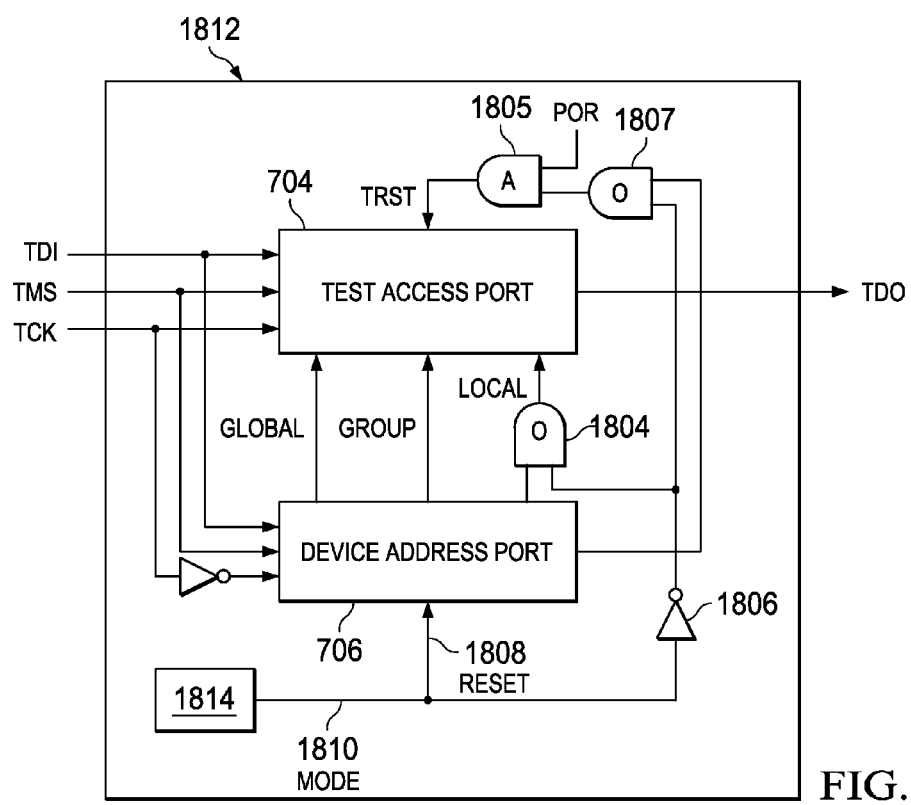
FIG. 18B illustrates a second example of how the ATAP can be adapted to allow the ATAP to operate in the serial arrangement of FIG. 16 or the parallel arrangement of FIG. 17.

FIG. 18B is provided to illustrate how a logic level on the Mode signal 1810 of an ATAP 1812 within a device (IC or core) could be provided without having to use an external pad of an IC or an external terminal of an embedded core as described in regard to ATAP 1802 of FIG. 18A. The ATAP 1812 is identical to ATAP 1802 with the exception that the Mode signal comes for a programmable circuit 1814 within the device (IC or core). The programmable circuit 1814 could be any type of known circuit that is programmable such that it can be set to output a logic high or a logic low. For example, programmable circuit 1814 could be an electronic fuse that can be blown open or left intact to create a desired logic high or logic low output. If circuit 1814 is programmed to output a logic low on Mode signal 1810 the ATAP 1812 is set to operate as a conventional TAP 100 within the serial arrangement of FIG. 16. If the circuit 1814 is programmed to output a logic high on Mode signal 1810 the ATAP 1812 is set to operate as an ATAP 702 within the parallel arrangement of FIG. 17. The benefit of using a programmable circuit 1814 to establish the serial or parallel arrangement operation of ATAP 1812 is that no additional external IC pad needs to be included on an IC and no additional external core terminal needs to be included on an embedded core. Not having to include an additional Mode signal pad on an IC may lead to reducing the IC package size by reducing the IC package pin count requirement, which is always advantageous in customer applications of the IC.

While the ATAPs 1802 and 1812 of FIGS. 18A and 18B provide the ability to select whether the ATAPs of an IC will operate as conventional TAPs 100 or ATAPs 702, they both require a programming step to be performed, that step being either; (1) the wiring an IC Mode signal pad 1810 high or low as described in FIG. 18A or (2) the programming of a circuit 1814 within an IC to set the Mode signal 1810 high or low as described in FIG. 18B. The following describes an automatic way of having the Mode signal 1810 of an IC set high for the parallel access arrangement of FIG. 17 or low for the serial access arrangement of FIG. 16. This automatic way of setting the Mode signal 1810 of an IC eliminates the need to have an additional IC pad for a Mode signal 1810 and the accompanying step of having to wire the IC Mode pad high or low.

Figure 19:
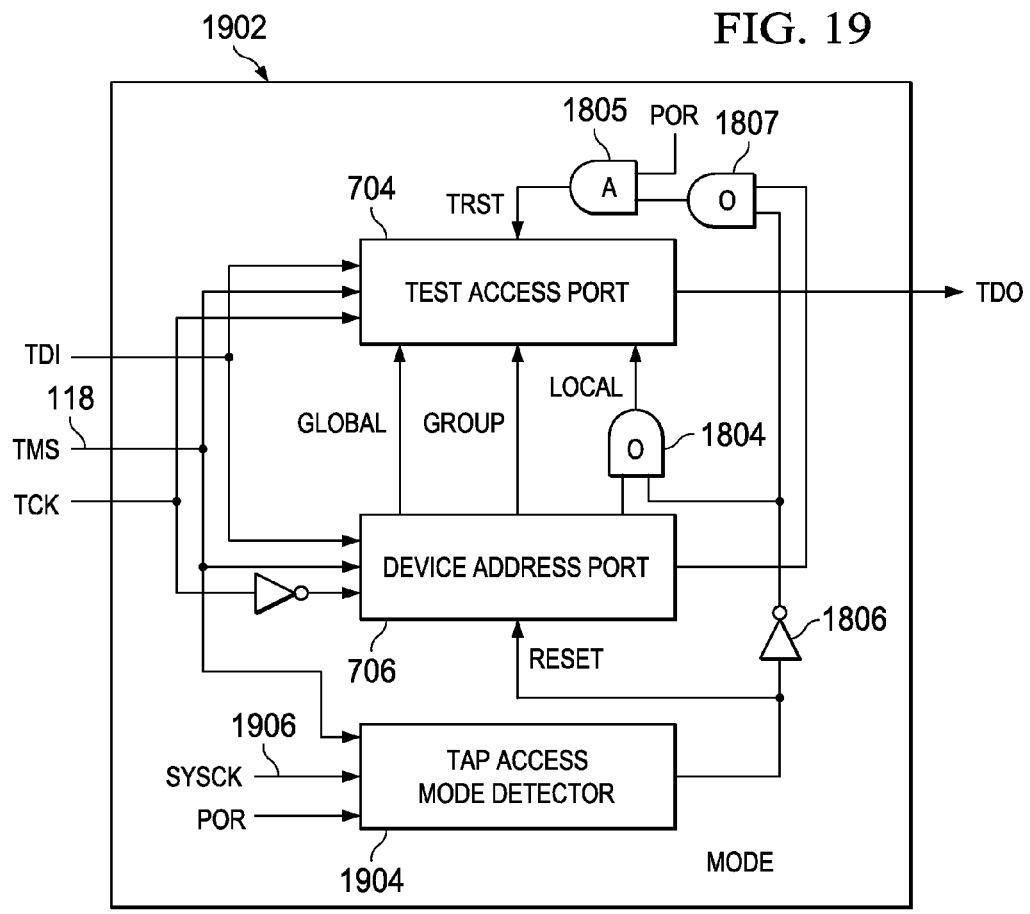
FIG. 19 illustrates an example of how the ATAP can be designed to automatically configure itself to operate in either the serial arrangement of FIG. 16 or the parallel arrangement of FIG. 17.

FIG. 19 illustrates an example of an ATAP 1902 of a device (IC or core) that is designed to automatically set the Mode signal 1810 high or low when the IC powers up. ATAP 1902 is identical in operation to ATAPs 1802 and 1812 with the exception that it includes a TAP Access Mode Detector circuit 1904 to control the Mode signal 1810. The Detector circuit 1904 has an input coupled to the TMS signal 118, an input coupled to a system clock (SYSCK) signal 1906, an input coupled to a POR signal, and an output coupled to the Mode signal 1810. The SYSCK signal 1906 comes from a clock producing circuit in the device, such as an oscillator or phase lock loop circuit. The SYSCK signal may be a functional clock signal within the device for clocking functional circuitry within the device. The Detector circuit 1904 is a state machine clocked by the SYSCK signal to sample the state of the TMS signal 118 to determine how to set the logic level of Mode signal output 1810.

Figure 20:
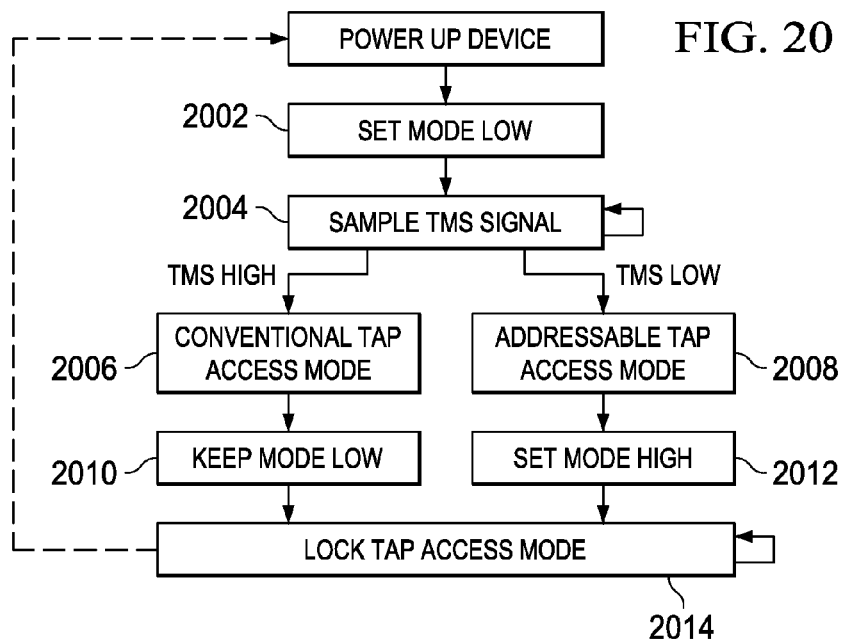
FIG. 20 illustrates an example state diagram operation of the TAP Access Mode Detector circuit of FIG. 19.

FIG. 20 illustrates an example timing diagram of the Detector circuit state machine 1904. As seen, when the IC first powers up, state machine 1904 responds to the POR signal to set the Mode signal 1810 low in state 2002. From state 2002 the state machine transitions in response to SYSCK to "Sample TMS Signal" state 2004. The state machine 1904 remains in state 2004 for a predetermined number of SYSCK cycles. While in state 2004 the state machine samples the logic level on the TMS signal 118 during each SYSCK cycles. After the predetermined number of SYSCKs have occurred the state machine determines if the TMS signal has been high or low during the sample period. If TMS has been high during the sample period, the state machine 1904 keeps the Mode signal 1810 low and transitions to the "Lock TAP Access Mode" state 2014 via intermediate state 2006 and 2010. If TMS has been low during the sample period, the state machine 1904 sets the Mode signal 1810 high and transitions to the "Lock TAP Access Mode" state 2014 via intermediate states 2008 and 2012. Once in the "Lock TAP Access Mode" state 2014, the state machine remains in that state 2014 and maintains the logic level setting of the Mode signal 1810 for as long as the device is powered up. When the device powers down and back up again the state machine will repeat the above described state transitions to once again establish a logic level on the Mode signal 1810. As can be understood from the above description, the TAP Access Mode Detector 1904 automatically determines whether to set the Mode signal high or low by sampling the logic level of the IC's TMS signal 118 immediately after the IC powers up. If a sufficient number of TMS logic lows are sampled, Mode signal 1810 is set low. If a sufficient number of TMS logic highs are sample, Mode signal 1810 is set high.

Figure 21:
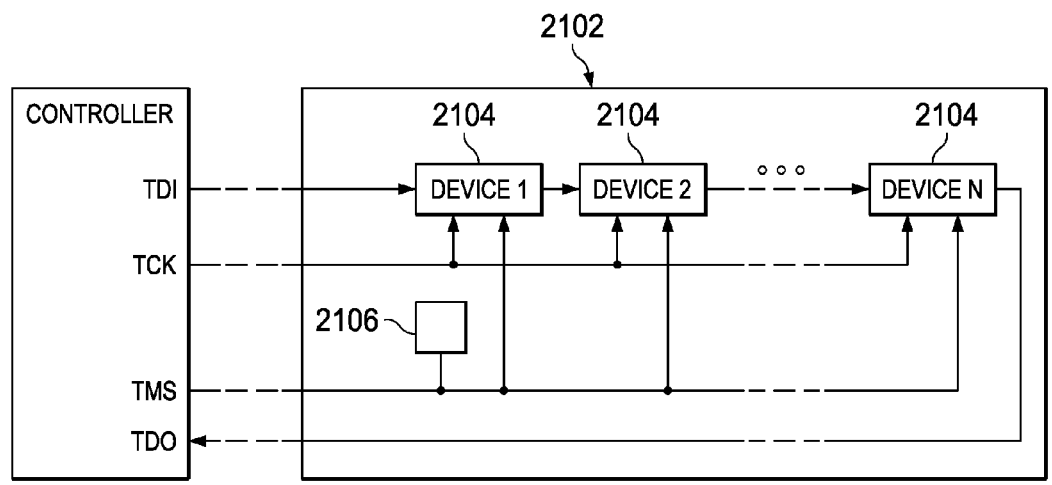
FIG. 21 illustrates an electronic system with a serial arrangement of device ATAPs that can be connected to a controller for serial access.

FIG. 21 illustrates an example customer electronic system 2102 with devices 2104, each device including the ATAP 1902 of FIG. 19 and each ATAP 1902 connected in the serial access arrangement of FIG. 16. The system 2102 could be a board and the devices 2104 could be ICs on the board. The system 2102 could also be an IC and the devices could be embedded cores within the IC. The TMS input of each ATAPs 1902 is pulled high by a pull up element on the TMS input of each device 2104, which is a requirement in IEEE standard 1149.1. The TMS signal may also be pulled high by a system level pull up element 2106. As can be seen, when the system is powered up, the TMS inputs to the device ATAPs 1902 will be set high by the device and system pull up elements. As described above in regard to FIGS. 19 and 20, the ATAPs 1902 will detect that the TMS signal is high after the system powers up and respond by setting their Mode signals 1810 low, which automatically configures the device ATAPs 1902 for the serial access arrangement of FIG. 21.

Figure 22:
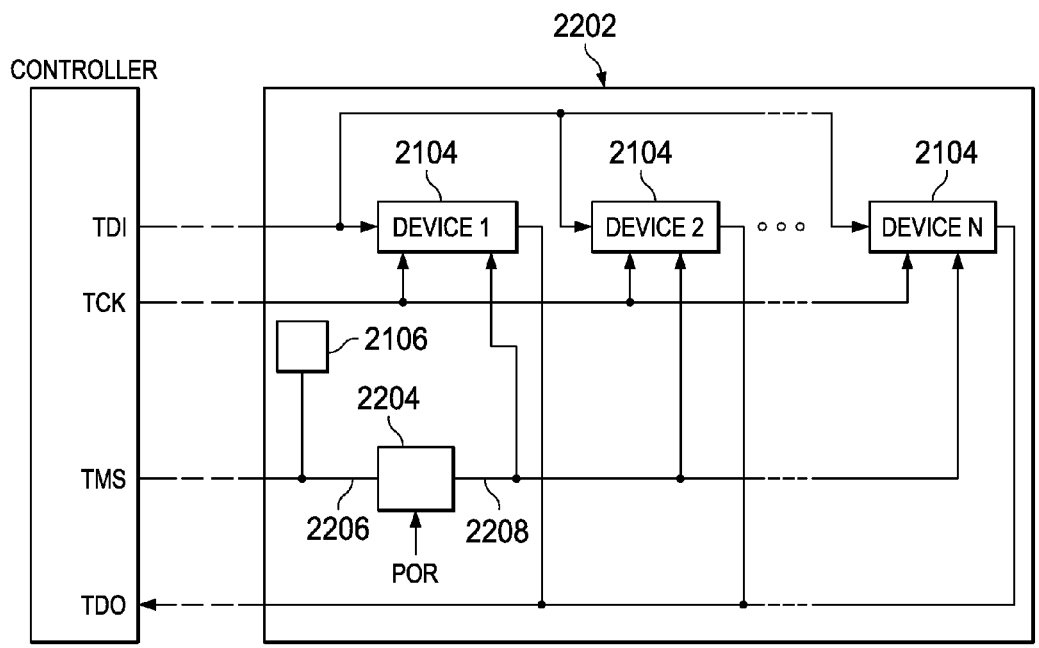
FIG. 22 illustrates an electronic system with a parallel arrangement of device ATAPs that can be connected to a controller for parallel access.

FIG. 22 illustrates an example customer electronic system 2202 with devices 2104, each device including the ATAP 1902 of FIG. 19 and each ATAP 1902 connected in the parallel access arrangement of FIG. 17. The system 2202 could be a board and the devices 2104 could be ICs on the board. The system 2202 could also be an IC and the devices could be embedded cores within the IC. A TMS Conditioner circuit 2204 has been inserted in the system TMS signal path with an input coupled to the system's TMS input signal path 2206 and an output coupled to the TMS signal path 2208 routed to each device ATAP 1902. The TMS Conditioner circuit 2204 also has an input coupled to a system level POR signal. The TMS signal path 2206 is attached to a pull up element 2106. When the system powers up, the TMS Conditioner circuit 2204 receives a POR input and responds by outputting a logic low level on TMS signal path 2208 for a certain amount of time, regardless of the logic level on TMS signal path 2206. The low on TMS signal path 2208 is held low long enough for the ATAPs 1902 of devices 2104 to sample a sufficient enough number of logic lows on their TMS input to lock the Mode signal 1810 high in state 2014 of FIG. 20. Once the ATAPs 1902 have automatically locked logic highs on their Mode signals 1810, they are enabled to operate as the previously described ATAPs 702 in the parallel access arrangement of FIG. 22.

As can be seen in FIGS. 21 and 22, the automatic settings of the ATAPs 1902 Mode signals 1810 is performed at power up of the systems 2102 and 2202 regardless of whether a controller is connected to the systems or not. The difference in the systems of FIGS. 21 and 22, in addition to the serial and parallel access arrangement of the device ATAPs 1902, is that the system of FIG. 22 includes the TMS Conditioner circuit 2204 on TMS signal path 2206 to temporarily set the TMS signal 2208 low after the system powers up, which causes the ATAPs 1902 to automatically lock the ATAPs 1902 into the parallel access mode. In system designs the TDI, TCK and TMS inputs to the system are buffered and the TDO output from the system is buffered. The TMS Conditioner circuit 2208 can be substituted for the TMS input buffer normally used. The TMS Conditioner circuit 2204 therefore provides the TMS signal buffering function as well as the TMS conditioning function necessary to allow the TAP Access Mode Detector 1904 of ATAP 1902 to automatically set the Mode signals 1810 of the ATAPs 1902 high to enable the ATAP parallel access arrangement of FIG. 22.

As can be seen in FIGS. 21 and 22, both systems 2102 and 2202 can use the same functional devices 1-N 2104, for example the same DSP device 1 and same CPU device 2. This is possible since the devices automatically configure themselves at power up to the serial arrangement of FIG. 21 or to the parallel arrangement of FIG. 22. Thus the manufacturers of ICs or providers of embedded cores need only provide a single functional version of each IC and core. For example, an IC manufacturer needs to design only one DSP IC that can be used as a device 1 on either of the customer boards 2102 or 2202. Likewise, an embedded core provider needs to provide only one CPU core that can be used as a device 2 on either of the customer ICs 2102 or 2202.

The TMS Conditioner circuit 2204 may be designed in many ways, including the way described in the example shown and described in FIG. 23 below.

Figure 23:
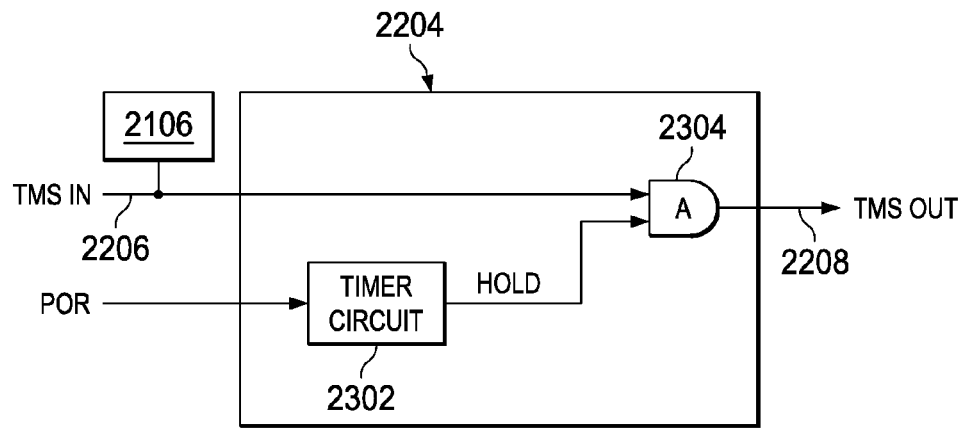
FIG. 23 illustrates an example design of the TMS Conditioner circuit of the system in FIG. 22.

FIG. 23 illustrates an example implementation of the TMS Conditioner circuit 2204 of FIG. 22 which comprises a Timer circuit 2302 and an AND gate 2304. The AND gate has an input coupled to the TMS signal path 2206, an input coupled to the Hold output of the Timer circuit 2302, and an output coupled to the TMS signal path 2208. The Timer circuit 2302 could be any type of timer circuit that responds to the POR input to set its output (Hold) low for a predetermined period of time, such as a one-shot monostable multi-vibrator circuit.

Figure 24:
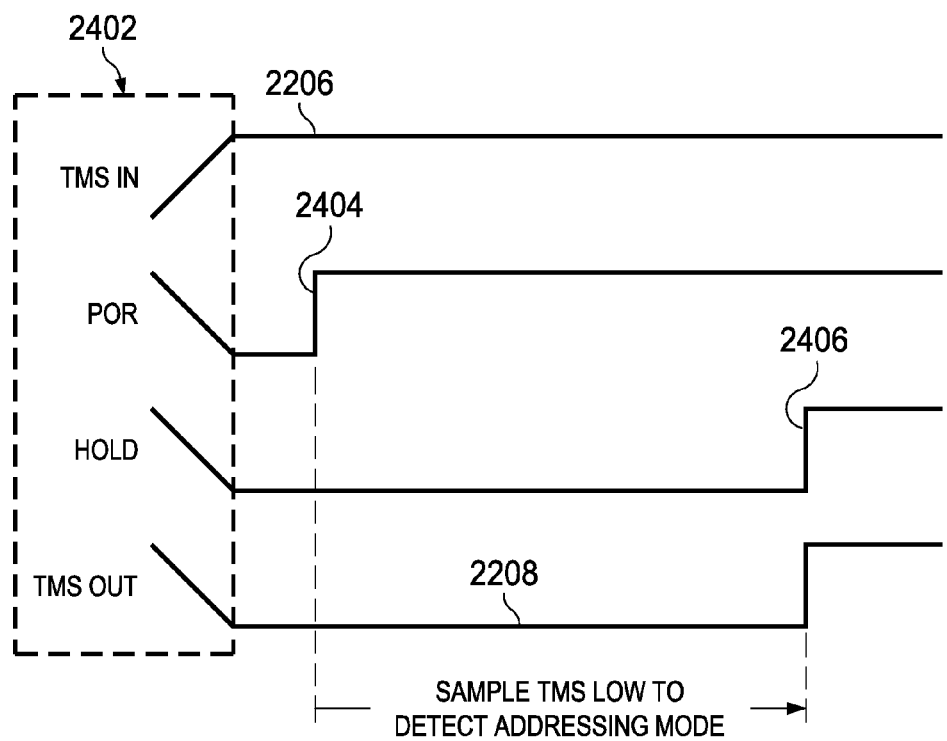
FIG. 24 illustrates the timing operation of the TMS Conditioner circuit of FIG. 23 following power up.

FIG. 24 illustrates the operation of the TMS Conditioner circuit 2204 after the system of FIG. 22 powers up at time 2402. Following time 2402, the TMS signal 2206 will go high due to pull up element 2106, the POR signal will go low then high at time 2404, the Hold output of Timer circuit 2302 will go low in response to POR going low and will remain low until time 2406, and the TMS signal 2208 will go low with the Hold signal and then go high with the Hold signal at time 2406. Once the Hold signal is high, the TMS 2208 is driven by the high on TMS signal 2206.

As seen in FIG. 24, the TMS signal path 2208 that connects to the TMS inputs of ATAPs 1902 is driven low from power up time 2402 through POR release time 2404 and on to time 2406. When POR release time 2404 occurs, the TAP Access Mode Detector circuits 1904 of ATAPs 1902 are enabled to execute the operation depicted in the state diagram of FIG. 20, namely the sampling of the TMS input. Since the TMS input 2208 will be low until time 2406, the Detector circuits 1904 will sample a sufficient number of logic lows on TMS 2208 to determine that the ATAPs 1902 should be set and locked in the Addressable TAP Access Mode, which enables the ATAPs to operate in the parallel arrangement of FIG. 22.

Addressable Functional Access Ports

While the above description of the disclosure on how a first clock edge (rising edge in the previous examples, but could be falling edge as well) provides a clock edge for a device test, debug, trace or programming while a second clock edge (falling edge in the previous examples, but could be rising edge as well) provides a clock edge for an addressing operation have been described in detail, the disclosure is not limited to only using the first clock edge for a test, debug, trace or programming operation. Indeed, the disclosure anticipates a broader use of the concept whereby the first clock edge is used to perform a functional operation while the second clock edge is used to address the functional operation to be performed.

Figure 25A:
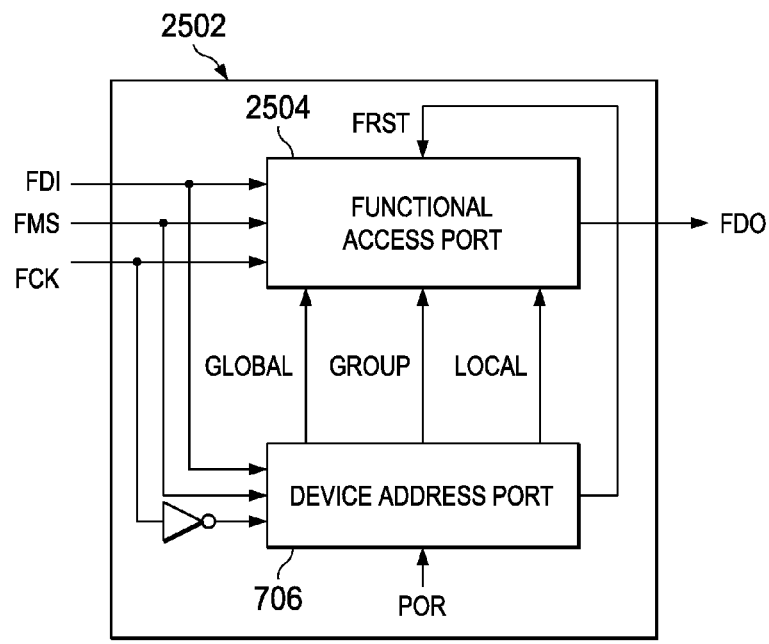
FIG. 25A illustrates an example addressable functional access port (AFAP) of a device according to the disclosure.

FIG. 25A illustrates an example addressable functional access port (AFAP) 2502 for use in an IC or core. The AFAP 2502 contains functional access port (FAP) 2504 and a DAP 706. The FAP and DAP are connected to functional data input (FDI), functional mode select (FMS) input, functional clock (FCK) input, and functional data output (FDO) signals. The DAP 702 operates in response to the FDI, FMS and FCK signals to address the FAP 2504 for access the same way that it responded to the TDI, TMS and TCK signals to select the TAP 704 of FIG. 7 for access. The FAP 2504 may be any type of functional circuit within an IC or core that inputs functional data (FDI) or inputs functional data (FDI) and outputs functional data (FDO) in response to a functional control signal (FMS) and a functional clock signal (FCK), whenever it is addressed by the DAP 706. For example, the FAP could be an I/O port of a shift register device, an I/O port of a memory device, an I/O port of a D/A converter device, an I/O port of an A/D converter device, an I/O port of a DSP device, an I/O port of a CPU device, or an I/O port of a mixed signal device.

Figure 25B:
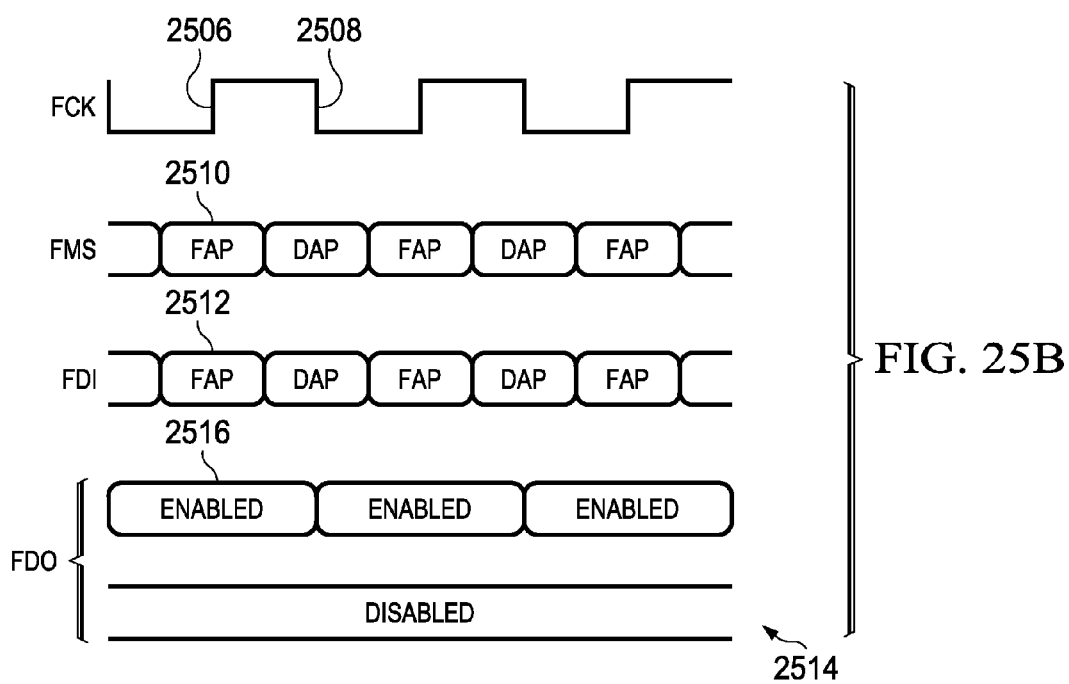
FIG. 25B illustrates the timing of the operation of the AFAP of FIG. 25A.

FIG. 25B illustrates example timing of the AFAP 2502. As with ATAP 702, the AFAP 2502 uses the first edge 2506 of a clock period to perform a functional operation and the second edge 2508 of the clock period to perform an addressing operation. The FAP 2504 responds to the functional reset (FRST), Global, Group and Local address signals from DAP 706 as previously described of the TAP 702 of FIG. 7. For example, if the FAP 2504 is enabled by the Global or Group signals, it can respond to control input on FMS 2510 to transition through states, or to input data from FDI 2512. During Global and Group addressing, the FDO output is disabled 2514. If the FAP 2504 is enabled by the Local signal, it can respond to control input on FMS 2510 to input data from FDI 2512 and output data on FDO 2516. If the FAP 2504 receives the FRST signal it is reset. The way the FAP responds to the FDI, FMS and FCK inputs and outputs on FDO, when enabled by the DAP, is user defined. The key is that the FAP 2504 can be enabled for access by the enable inputs from the DAP 706 as was the TAP 704. Devices (IC or cores) with AFAPs 2502 can be arranged in parallel as shown for the devices with ATAPs 702 of FIG. 13. Like the ATAPs 702, the AFAPs 2502 in the parallel arrangement of FIG. 13 can be accessed globally, in one or more selected groups, or locally by a functional controller as described in regard to access steps described in FIGS. 13A-C.

Figure 26:
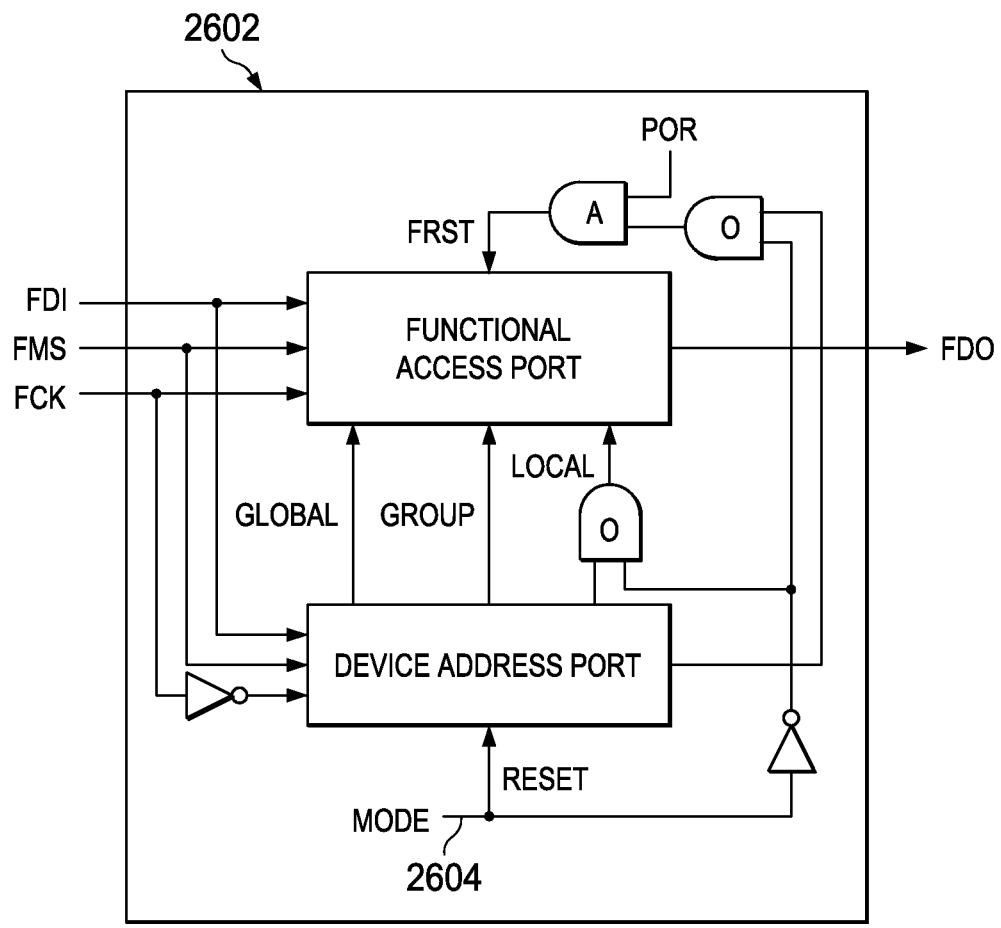
FIG. 26 illustrates how the AFAP of a device may be adapted to allow it to operate in either a serial arrangement of device AFAPs or a parallel arrangement of device AFAPs.

FIG. 26 is provided to illustrate that the AFAP 2502 can be adapted into an AFAP 2602, like the ATAP 702 was adapted into ATAP 1802 of FIG. 18A, to allow the AFAP to be programmed by a Mode signal 2604 such that devices with AFAPs 2602 can operate in either the serial access arrangement of FIG. 21 or the parallel access arrangements of FIG. 22. As previously described, the Mode signal 2604 can be controlled by an external device terminal as shown in FIG. 18A, a programmable circuit as shown in FIG. 18B, or by an Access Mode Detector circuit as shown in FIG. 19.

It is important to note that the addressing scheme of the disclosure, used to switch between accessing different devices with ATAPs or AFAPs, can be done while each device is being accessed. For example, during access of a currently selected device the address of the next device to be accessed can be transparently input. Therefore no time is required to use the addressing scheme of the disclosure to switch between accessing devices as described below.

Figure 27:
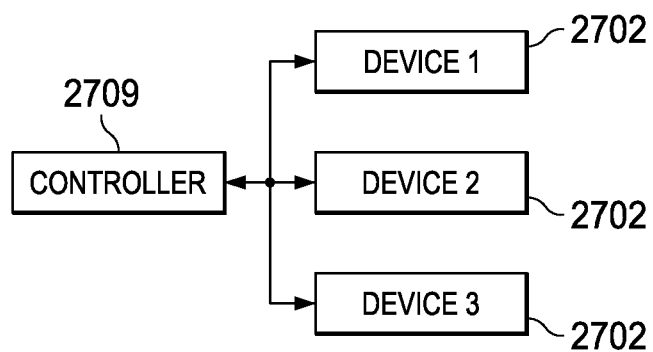
FIG. 27 illustrates three devices with ATAPs or AFAPs arranged in parallel and connected to a controller.

FIG. 27 illustrates three devices 2702 with ATAPs or AFAPs configured into a parallel arrangement and connected to a controller 2704.

Figure 28:
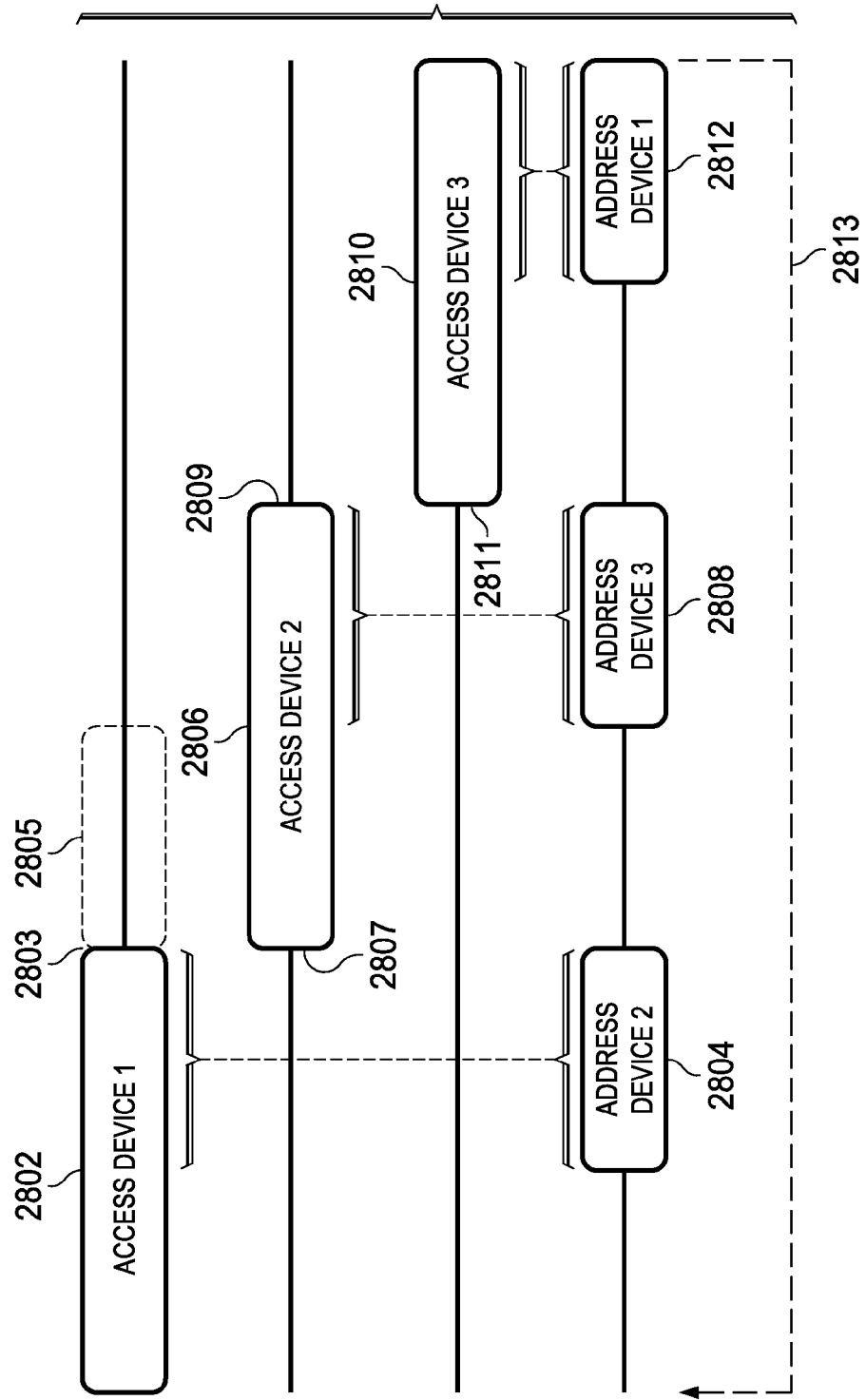
FIG. 28 illustrates how the address for accessing a next device is transparently input during the access of a currently selected device of FIG. 27.

FIG. 28 illustrates a time flow diagram of how the controller accesses and addresses each device 1-3 of FIG. 27, according to the disclosure. At time period 2802, the controller is accessing device 1. Near the end of time period 2802 the controller inputs a Shift Address Register operation, as described in regard to FIG. 12, to the device DAPs 706 to input the address of device 2 during time period 2804. The address of device 2 is input during time period 2804 as described in regard to FIGS. 15B and 15C. As previously shown and described in FIG. 15C, the Update-CR state of the address shift register operation is aligned with a state 1516 that the currently selected device 1 is to be disabled in at time 2803. As previously shown and described in regard to FIG. 15B, device 2 will become enabled for access in response to the occurrence of the Update-CR state at time 2807.

As seen, time period 2804 occurs during time period 2802 and thus the addressing step of the disclosure does not insert any time delays, as indicated in dotted line time period 2805, between the accessing of device 1 and the accessing of device 2. Similarly, near the end of accessing device 2 during time period 2806, the address for device 3 is input at time period 2808. In response to address 3, device 2 is disabled at time 2809 and device 3 is enabled at time 2811. As indicated, the device addressing scheme can continue from accessing device 3 back to accessing device 1 at time 2813 if desired.

As can be seen in FIG. 28, the advantage of the addressing scheme of the disclosure is that it allows devices to be addressed and accessed without having to insert time between device accesses to input a device address. Prior art TAP addressing techniques, such as the previously mentioned Texas Instruments Addressable Scan Port 8996 device and National Semiconductor's ScanBridge STA112 device, all require a time period to be insert between accesses of device TAPs to allow inputting the address of the next TAP to be accessed.

It should be understood that the controller of FIG. 28 could be a functional controller such as a DSP or CPU and the devices coupled to the controller could be functional devices such as memories, digital circuits, mixed signal circuits, peripheral circuits or I/O circuits.

While the present disclosure has described the ATAP as a circuit for improving the customer's ability test, debug, trace and program ICs from an IC manufacturer, the IC manufacturer can also benefit from the ATAP in the testing of die on wafer, the testing of die in a burn-in chamber, and the testing of packaged ICs, as described below.

Figure 29:
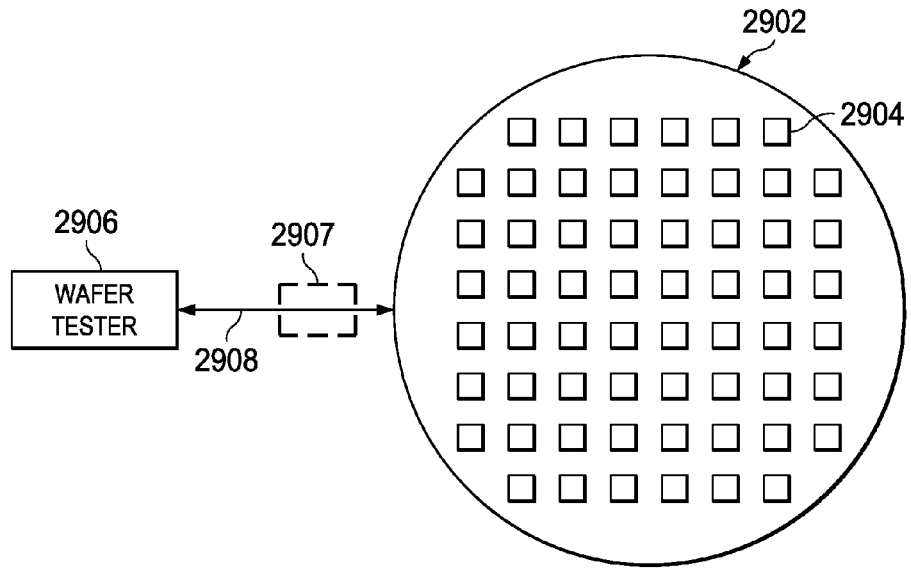
FIG. 29 illustrates a wafer test system according to the disclosure.

FIG. 29 illustrates a wafer 2902 of die 2904 and a tester 2906 for testing each die on the wafer. Each die has an ATAP circuit that can be contacted by the tester, via a contacting mechanism 2907, and tested via the JTAG bus 2908 signals TDI, TCK, TMS, TDO and optionally TRST. The tester can; (1) contact all or a selected group of die on the wafer in parallel using a single JTAG signal bus 2908, (2) select (i.e. address) one or more of the contacted die for testing using the die ATAP circuits, and (3) test the die(s).

Figure 30:
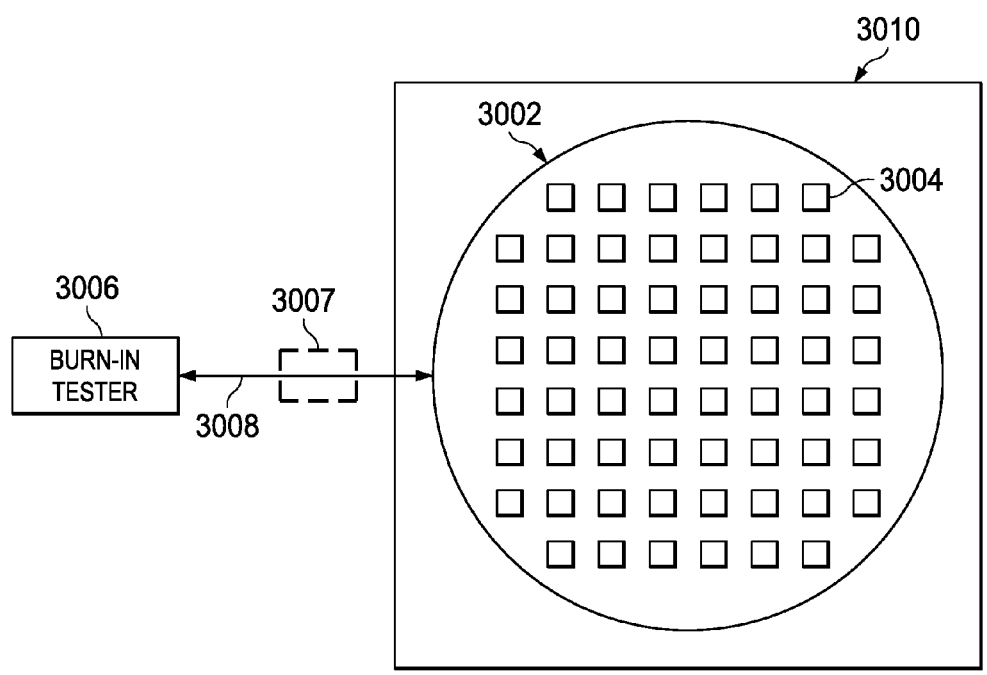
FIG. 30 illustrates a burn-in test system according to the disclosure.

FIG. 30 illustrates a wafer 3002 of die 3004 in a burn-in chamber 3010 and a burn-in tester 3006 for testing the die on the wafer during burn-in. Each die has an ATAP circuit that can be contacted by the tester, via a contacting mechanism 3007, and tested via the JTAG bus 3008 signals TDI, TCK, TMS, TDO and optionally TRST. The tester can; (1) contact all or a selected group of die on the wafer in parallel using a single JTAG signal bus 3008, (2) select (i.e. address) one or more or the contacted die for testing using the die ATAP circuits, and (3) test the die(s).

Figure 31:
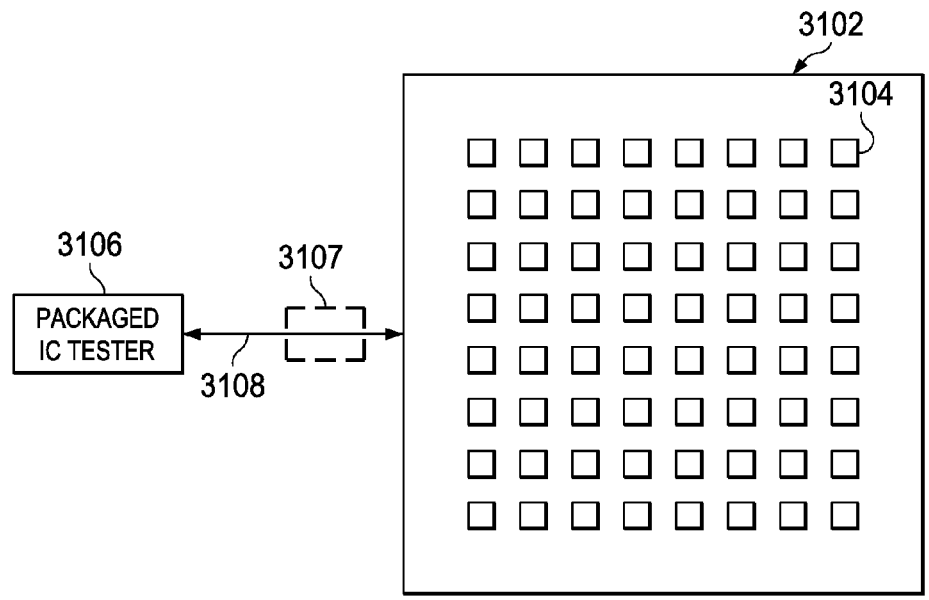
FIG. 31 illustrates a packaged IC test system according to the disclosure.

FIG. 31 illustrates a packaged IC carrier or fixture 3102 containing packaged ICs 3104 and a packaged IC tester 3106 for testing the packaged ICs in the carrier. Each packaged IC has an ATAP circuit that can be contacted by the tester, via a contacting mechanism 3107, and tested via the JTAG bus 3108 signals TDI, TCK, TMS, TDO and optionally TRST. The tester can; (1) contact all or a selected group of packaged ICs in the carrier in parallel using a single JTAG signal bus 3008, (2) select (i.e. address) one or more of the packaged ICs for testing using the ATAP circuits, and (3) test the packaged ICs.

In each example of FIGS. 28-30 the tester only has to contacted the die or ICs using the JTAG bus 2908, 3008, 3108, and power and ground buses. Thus the cost of the testers and the contacting mechanisms of FIGS. 29-31 can be significantly reduced.

Figure 33:
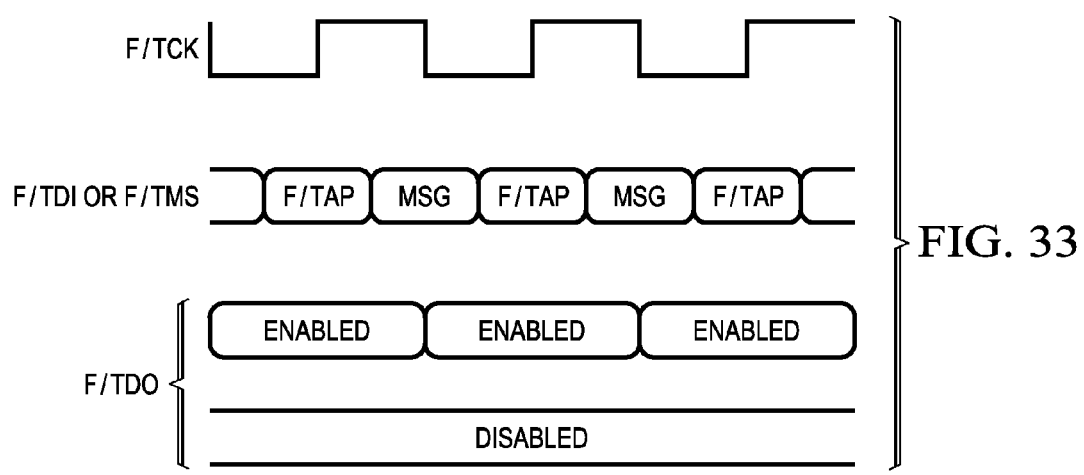
FIG. 33 illustrates the timing of the message based addressable access port of FIG. 32.
Figure 34:
FIG. 34 illustrates an example message format that could be used to realize the message based addressable access port of FIG. 32.

While the disclosure has described the DAP as having connections to TDI, TMS and TCK to cause the DAP to input an address on the falling edge of TCK, it should be understood that other type of DAPs may be designed that only require connections to TDI and TCK or to TMS and TCK as described in FIGS. 32, 33, and 34 below.

Figure 32:
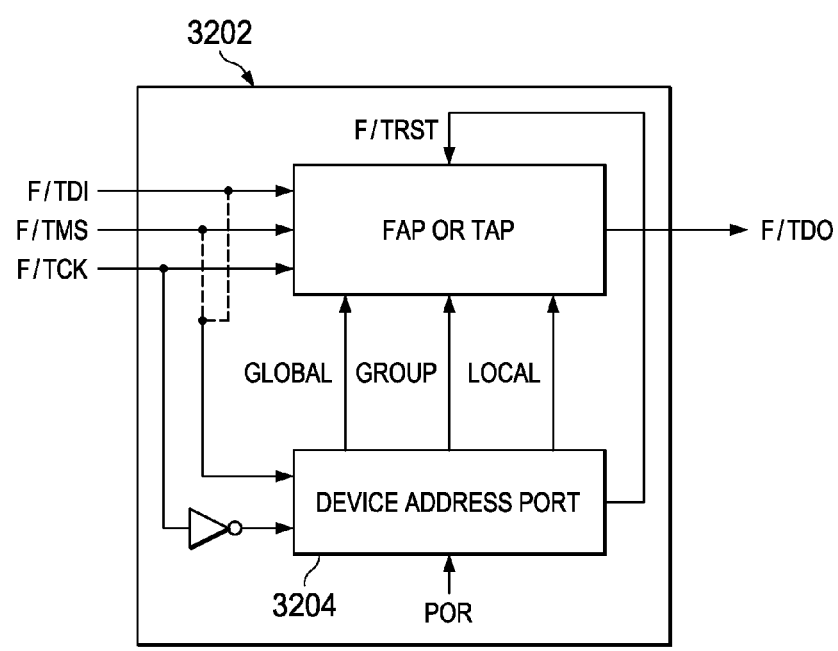
FIG. 32 illustrates an example implementation of a message based addressable access port according to the disclosure.

FIG. 32 illustrates a device ATAP 3202 comprising either the TAP 704 of FIG. 7 or the FAP 2504 of FIG. 25A coupled to a DAP 3204. Unlike DAP 706, DAP 3204 only requires a connection to TCK and a connection to one of the TDI or TMS signals. As seen in the timing diagram of FIG. 33, DAP 3204 inputs the address from either the TDI or TMS signal on the falling edge of TCK using a message (MSG) format, such as the standard "Header-Body-Trailer" message format shown in FIG. 34. The message Header initiates the address input operation, the message Body contains the address to be input, and the message Trailer terminates the address input operation. The function of the DAP 3204 to set the Global, Group or Local TAP enable signals remains the same. The only difference between DAP 3204 and DAP 706 is that DAP 3204 utilizes a message that is input on TDI or TMS on the falling edge of TCK to input addresses instead of using the TMS and TDI inputs as previously described. The DAP 706 is much simpler to design that the DAP 3206 since the circuitry required to receive address messages on a single input is typically much more complicated than the simple state machine 1102 of the DAP 706 of FIG. 11.

Although the disclosure has been described in detail, it should be understood that various changes, substitutions and alterations may be made without departing from the spirit and scope of the disclosure as defined by the appended claims.

Some further aspects of the disclosed embodiments include:

A method of inputting data and address signals on an input of a device comprising the steps of inputting a data signal on the device input during a first edge of a clock period; and inputting an address signal on the same device input during the next edge of the clock period.

A test access port comprising a TAP state machine having a TMS input, a TCK input, and control outputs, an instruction register having control inputs coupled to the control outputs of the TAP state machine, a TDI input, and a TDO output, a data register having control input coupled to the control outputs of the TAP state machine, a TDI input, and a TDO output, a TDO output buffer having an data input coupled to one of the TDO outputs of the instruction and data registers, a buffer enable input, and a data output, a first gate having an input coupled to a TCK signal, an input coupled to a TAP enable signal, and an output coupled to the TCK input of the TAP state machine; and a second gate having an input coupled to a control output from the TAP state machine, and input coupled to the TAP enable signal, and an output coupled to the buffer enable input.

A state machine for shifting an address to an address register comprising at least a state for resetting the address register, a state for idling the state machine, a state for selecting the address register for shifting, a state for shifting an address into the address register; and a state for storing the result of a comparison between the address shifted into the address register and another address.

An electronic system comprising plural devices, each having a TDI input, a TCK input, a TMS input and a TDO output, a first connection formed between the TDI inputs of the devices, a second connection formed between the TCK inputs of the devices, a third connection formed between the TMS inputs of the devices, a fourth connection formed between the TDO outputs of the devices; and a controller coupled to the TDI, TCK, TMS and TDO connections of the devices, said controller operable to input data signals to the TDI inputs of the devices on the rising edge of TCK and address signals to the TDI inputs of the devices on the falling edge of TCK.

The electronic system the preceding paragraph wherein the address signals input to the TDI input of the devices is used to select one of the devices to be accessed by the controller.

The electronic system of the preceding paragraph wherein the address signals input to the TDI input of the devices is used to select a group of the devices to be accessed by the controller.

The electronic system of the preceding paragraph wherein the address signals input to the TDI input of the devices is used to select all of the devices to be accessed by the controller.

An electrical device comprising a test access port state machine responsive to a TMS input signal on the rising edge of a TCK signal; and an address circuit state machine responsive to a TMS input signal on the falling edge of the TCK signal.

The device of the preceding paragraph wherein the TMS signal input to the test access port state machine causes the test access port state machine to transition through its states while the TMS signal input to the address circuit state machine causes the address circuit state machine to be idle in one of its states.

The device of the preceding paragraph wherein the TMS signal input to the address circuit state machine causes the address circuit state machine to transition through its states while the TMS signal input to the test access port state machine causes the test access port state machine to be idle in one of its states.

The device of the preceding paragraph wherein the TMS signal input to the test access port state machine causes the test access port state machine to transition through its states and the TMS signal input to the address circuit state machine causes the address circuit state machine to transition through its states.

The device of preceding paragraph wherein the TMS signal input to the test access port state machine and the TMS signal input to the address circuit state machine causes both state machines to be idle in one of their states.

An electrical device comprising a test access port having a TMS input, a TCK input, and an enable input, said test access port enabled to respond to the TMS input signal on the rising edge of the TCK input when the enable input is at a first logic level and disabled from responding to the TMS input signal on the rising edge of the TCK when the enable input is at a second logic level, an address circuit having a TMS input, a TCK input, and an enable output, said address circuit response to the TMS input on the falling edge of the TCK input to set the enable output to one of said first and second logic states; and a connection formed between the enable output of the address circuit and the enable input of the test access port.

An externally programmable test access port for use within a device comprising a test access port having a TDI input, a TMS input, a TCK input, a TDO output, and an enable input for enabling and disabling the operation of the test access port, a device address port having a TDI input, a TMS input, a TCK input, and an enable output, a gate having an input coupled to the enable output of the device address port, an input coupled to an enable signal provided external of the device, and an output coupled to the enable input of the test access port.

An internally programmable test access port for use within a device comprising, a test access port having a TDI input, a TMS input, a TCK input, a TDO output, and an enable input for enabling and disabling the operation of the test access port, a device address port having a TDI input, a TMS input, a TCK input, and an enable output, a gate having an input coupled to the enable output of the device address port, an input coupled to an enable signal provided internal to the device, and an output coupled to the enable input of the test access port.

An automatically programmable test access port for use within a device comprising a test access port having a TDI input, a TMS input, a TCK input, a TDO output, and an enable input for enabling and disabling the operation of the test access port, a device address port having a TDI input, a TMS input, a TCK input, and an enable output, a test access port access mode detector circuit having an input coupled to a device system clock, an input coupled to the TMS input, and an enable output; and a gate having an input coupled to the enable output of the device address port, an input coupled to the enable output of the test access port access mode detector circuit, and an output coupled to the enable input of the test access port.

A method of automatically setting a device test access port to operate in a serial arrangement with other device test access ports in the serial arrangement or to operate in an addressable parallel arrangement with other device test access ports in the addressable parallel arrangement comprising the steps of; powering up the device and test access port, sampling the TMS input to the test access port for a first or second logic level, ceasing the sampling of the TMS input, determining the TMS logic level during the sampling, setting the test access port for use in the serial arrangement if the TMS signal was determined to be at the first logic level, or setting the test access port for use in the addressable parallel arrangement if the TMS signal was determined to be at the second logic level.

An electronic system comprising plural devices, each having a TDI input, a TCK input, a TMS input and a TDO output, a first connection formed between the TDI inputs of the devices, a second connection formed between the TCK inputs of the devices, a third connection formed between the TMS inputs of the devices, a fourth connection formed between the TDO outputs of the devices, a TMS conditioner circuit having a TMS input, a power on reset input, and a TMS output, a pull up element coupled to the TMS input of the TMS conditioner circuit; and a connection formed between the TMS output of the TMS conditioner circuit and the TMS inputs of the devices.

The TMS conditioner circuit of preceding paragraph wherein a temporary reset pulse on the power up reset input causes the TMS conditioner circuit to output a logic level on the TMS output signal that is independent of the logic level on the TMS input signal for a period of time after the reset pulse.

An electrical device comprising a functional access port circuit having a functional clock input, a functional control input, a functional data input, an enable input, and a functional data output; and a device address port circuit having inputs coupled to the functional clock input, the functional control input, the functional data input, and an enable output coupled to the enable input.

A method of inputting both functional data and address data on a data input terminal of a device comprising the steps of inputting functional data on the device input terminal during a first edge of a functional clock period; and inputting address data on the same device input terminal during the next edge of the functional clock period.

A programmable functional access port for use within a device comprising a functional access port having a functional data input, a functional control input, a functional clock input, a functional data output, and an enable input for enabling and disabling the operation of the functional access port, a device address port having an inputs coupled to the functional data input, functional control input, functional clock input, and an enable output; and a gate having an input coupled to the enable output of the device address port, an input coupled to a separate enable signal, and an output coupled to the enable input of the functional access port.

The programmable functional access port of preceding paragraph wherein the separate enable signal is provided by a circuit external to the device.

The programmable functional access port of preceding paragraph wherein the separate enable signal is provided by a circuit internal to the device.

A method of eliminating the addressing time between accessing devices connected to a controller comprising the steps of accessing a device for a first period of time, inputting the address of a next device to be accessed for a second period of time that occurs within the first period of time; and accessing the second device for a third period of time.

A wafer test system comprising a wafer tester having an output for transmitting TDI signals, an output for transmitting TMS signals, an output for transmitting TCK signals, and an input for receiving TDO signals, a wafer of die, each die containing an ATAP circuit with inputs for TDI, TMS and TCK, and an output for TDO, a contacting mechanism for electrically connecting the TDI, TMS, TCK and TDO signals of the tester to the TDI, TMS, TCK and TDO signals of all or a selected group of the die on the wafer.

A burn in test system comprising a burn in tester having an output for transmitting TDI signals, an output for transmitting TMS signals, an output for transmitting TCK signals, and an input for receiving TDO signals, a wafer of die, each die containing an ATAP circuit with inputs for TDI, TMS and TCK, and an output for TDO, a burn-in chamber for controlling the temperature of the wafer during test; and a contacting mechanism for electrically connecting the TDI, TMS, TCK and TDO signals of the burn in tester to the TDI, TMS, TCK and TDO signals of all or a selected group of the die on the wafer.

A packaged IC test system comprising a packaged IC tester having an output for transmitting TDI signals, an output for transmitting TMS signals, an output for transmitting TCK signals, and an input for receiving TDO signals, a test fixture containing packaged ICs to be tester, each IC containing an ATAP circuit with inputs for TDI, TMS and TCK, and an output for TDO, a contacting mechanism for electrically connecting the TDI, TMS, TCK and TDO signals of the tester to the TDI, TMS, TCK and TDO signals of all or a selected group of the packaged ICs in the test fixture.

An electrical device comprising an access port circuit having a clock input, a control input, a data input, an enable input, and a data output; and an address port circuit having an input coupled to the clock input of the access port, an input coupled to one of the control and data inputs of the access port, and an enable output coupled to the enable input of the access port.

A method of inputting both data and address signals on a data input terminal of a device comprising the steps of inputting data on the device input terminal during a first edge of a clock period; and inputting a message containing an address on the device input terminal during the next edge of the clock period.

I claim:

1. An integrated circuit comprising:
   A. a test data input lead, a test clock lead, a test mode select lead, and a test data output lead;
   B. test access port circuitry including:
      i. a TAP state machine having a test clock input connected to the test clock lead, a test mode select input, and control outputs;
      ii. an instruction register having a test data input connected to the test data in lead, a test data output, control inputs connected to the control outputs, and instruction outputs;
      iii. a data register having a test data input connected to the test data in lead, a test data output, and control inputs connected to the control outputs;
      iv. multiplexer circuitry coupling the test data outputs of the instruction register and the data register to the test data out lead; and
      v. control circuitry having an input connected to the test mode select lead, having a local control input, a group control input, and a global TAP control input, and an output connected to the test mode select input of the state machine; and
   C. device address port circuitry having a test clock input coupled to the test clock lead, a test mode select input connected to the test mode select lead, a test data input connected to the test data input lead, and local, group, and global TAP control outputs connected to the respective local, group, and global TAP control inputs.

2. The integrated circuit of claim 1 in which the state machine implements the states of Test Logic Reset, Run Test/Idle, Select-DR, Capture-DR, Shift-DR, Exit1-DR, Pause-DR, Exit2-DR, and Update-DR.

3. The integrated circuit of claim 1 in which the state machine implements the states of Test Logic Reset, Run Test/Idle, Select-DR, Capture-DR, Shift-DR, Exit1-DR, Pause-DR, Exit2-DR, and Update-DR in response to rising edges of a clock signal on the test clock lead and in response to a logic state on the test mode select lead.

4. The integrated circuit of claim 1 in which the test access port circuitry responds to data signals on the test data input lead in response to rising edges of a clock signal on the test clock lead and in response to a logic state on the test mode select lead.

* * * * *